United States Patent
Arvin et al.

(10) Patent No.: US 9,324,669 B2
(45) Date of Patent: Apr. 26, 2016

(54) USE OF ELECTROLYTIC PLATING TO CONTROL SOLDER WETTING

(71) Applicant: International Business Machines Corporation, Armonk, NY (US)

(72) Inventors: Charles L. Arvin, Savannah, GA (US); Brian M. Erwin, Lagrangeville, NY (US); Eric D. Perfecto, Poughkeepsie, NY (US); Wolfgang Sauter, Eagle-Vail, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/484,313

(22) Filed: Sep. 12, 2014

(65) Prior Publication Data

US 2016/0079193 A1  Mar. 17, 2016

(51) Int. Cl.
   *H01L 23/00* (2006.01)
(52) U.S. Cl.
   CPC ......... *H01L 24/11* (2013.01); *H01L 2224/1182* (2013.01); *H01L 2224/11462* (2013.01); *H01L 2224/11622* (2013.01); *H01L 2224/11849* (2013.01); *H01L 2224/136* (2013.01); *H01L 2224/13147* (2013.01); *H01L 2924/014* (2013.01); *H01L 2924/0105* (2013.01); *H01L 2924/01079* (2013.01); *H01L 2924/01327* (2013.01); *H01L 2924/0544* (2013.01)

(58) Field of Classification Search
   CPC ......... H01L 24/11; H01L 24/13; H01L 24/81; H01L 2924/14
   USPC .......................................... 257/737; 438/614
   See application file for complete search history.

(56) References Cited

U.S. PATENT DOCUMENTS

| 5,035,918 | A |  | 7/1991 | Vyas |  |
|---|---|---|---|---|---|
| 6,017,613 | A | * | 1/2000 | Baum et al. | 428/209 |
| 7,855,137 | B2 |  | 12/2010 | Farooq et al. |  |
| 8,227,918 | B2 |  | 7/2012 | Lu et al. |  |
| 8,441,124 | B2 |  | 5/2013 | Wu et al. |  |
| 8,450,849 | B2 |  | 5/2013 | Lu et al. |  |
| 8,637,392 | B2 |  | 1/2014 | Arvin et al. |  |
| 8,669,137 | B2 |  | 3/2014 | Nah et al. |  |
| 2005/0103636 | A1 |  | 5/2005 | Cheng et al. |  |
| 2009/0096092 | A1 | * | 4/2009 | Patel | 257/737 |
| 2009/0267228 | A1 | * | 10/2009 | Arvin et al. | 257/737 |
| 2011/0063815 | A1 | * | 3/2011 | Lu et al. | 361/803 |
| 2011/0260317 | A1 | * | 10/2011 | Lu et al. | 257/737 |
| 2012/0040246 | A1 | * | 2/2012 | Sakai et al. | 429/217 |
| 2012/0091577 | A1 | * | 4/2012 | Hwang et al. | 257/737 |

OTHER PUBLICATIONS

Flipchip International, "Keeping up with the industry heavyweights", YOLE ASKS, May 2013, Issue No. 27, 3 D Packaging, www.flipchip.com, pp. 1-2.

* cited by examiner

*Primary Examiner* — Cuong Q Nguyen
*Assistant Examiner* — Tong-Ho Kim
(74) *Attorney, Agent, or Firm* — Steven J. Meyers; Hoffman Warnick LLC

(57) ABSTRACT

A method including forming a copper pillar, electroplating a metal layer on a top surface and a sidewall of the copper pillar, and electroplating a metal cap above the top surface of the copper pillar in direct contact with the metal layer. The method further including forming an intermetallic by heating the metal layer and the copper pillar in a non-reducing environment, the intermetallic including elements of both the copper pillar and the metal layer, where molten solder will wet to the metal cap and will not wet to the intermetallic.

16 Claims, 18 Drawing Sheets

USE OF ELECTROLYTIC PLATING TO CONTROL SOLDER WETTING

BACKGROUND

The present invention generally relates to semiconductor fabrication, and more particularly to the use of electrolytic plating to control solder wettability of a copper pillar.

Flip chip technology has been widely used as it allows a high I/O count, high density interconnection scheme with proven performance and reliability. Solder bumps are deposited on contact pads on chip surfaces and the chips are then flipped and positioned such that the solder bumps are aligned with matching pads of an external circuit. Solder reflow completes the interconnection process, after which underfill material is introduced to fill the spaces about the interconnections.

Flip chip interconnection assemblies have included copper pillars having solder caps. The copper pillars and solder caps may each be formed by electroplating. The advantages in copper lie in the extendability to finer pitch and the superior electromigration (EM) performance compared to conventional solder C4's. The copper pillar provides the enhanced EM performance but increases the die stress for chip-to-chip and chip-to-wafer joints (i.e., 3D applications). The finer pitch is due to its vertical sidewall.

In copper pillar technology, a small amount of solder is still required to connect the copper pillars on the chips to the pad on the substrate. However, copper pillar-based solder connectors are relatively expensive to fabricate and also difficult to prevent the solder from wetting to the copper pillar sidewall. Such wetting to the sidewall will reduce the standoff, therefore limiting underfill flow and can sometimes lead to solder bridging.

Copper pillars are used to increase the reliability of the packaged chip because it is a taller structure that joins two entities (silicon chip and organic package, for example) which may be severely mismatched in terms of their coefficients of thermal expansions (CTEs). It is true that the additional height of pillars in comparison to standard solder bump interconnects produce increased strain for a given amount of expansion mismatch for a single interconnect of the same diameter. However, a copper pillar with non-wettable sidewalls allows either more interconnects for a given area or a larger diameter which help to offset or even reduce the increase in strain. The increase in height provides improvement for both cleaning after chip attach and underfill filling of the module. Both of these improve reliability of the module.

SUMMARY

According to one embodiment of the present invention, a method is provided. The method may include forming a copper pillar, electroplating a metal layer on a top surface and a sidewall of the copper pillar, and electroplating a metal cap above the top surface of the copper pillar in direct contact with the metal layer. The method further including forming an intermetallic by heating the metal layer and the copper pillar in a non-reducing environment, the intermetallic including elements of both the copper pillar and the metal layer, where molten solder will wet to the metal cap and will not wet to the intermetallic.

According to another embodiment of the present invention, a method is provided. The method may include forming a copper pillar, forming a solder bump directly on a top surface of the copper pillar by electroplating a solder cap and reflowing the solder cap to form the solder bump, electroplating a metal layer on a top surface of the solder bump and on a sidewall of the copper pillar, and forming an intermetallic from a first portion of the metal layer in contact with the sidewall of the copper pillar by heating the metal layer and the copper pillar in a non-reducing environment, the intermetallic including elements of both the copper pillar and the metal layer, a second portion of the metal layer in contact with the solder bump remains unreacted.

According to another embodiment of the present invention, a method is provided. The structure may include forming a copper pillar, electroplating a first metal layer on a top surface and a sidewall of the copper pillar, and electroplating a second metal layer on top of the first metal layer, where molten solder will wet to the second metal layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 illustrates electrolytically forming a copper pillar above a stack of layers on top of a dielectric layer according to an exemplary embodiment.

FIG. 2 illustrates electrolytically forming a solder cap above the copper pillar according to an exemplary embodiment.

FIG. 3 illustrates reflowing the solder cap to form a solder bump according to an exemplary embodiment.

FIG. 4 illustrates depositing a metal layer according to an exemplary embodiment.

FIG. 5 illustrates heating the metal layer according to an exemplary embodiment.

FIG. 6 illustrates removing an unreacted portion of the metal layer from above the solder bump according to an exemplary embodiment.

FIG. 7 illustrates an alternative structure according to an exemplary embodiment.

FIG. 8 illustrates an alternative structure according to an exemplary embodiment.

FIGS. 9-18 illustrate modifying the wettability characteristics of a copper pillar using electrodeposition according to another exemplary embodiment.

FIG. 9 illustrates forming a photoresist layer above a stack of layers according to an exemplary embodiment.

FIG. 10 illustrates exposing the photoresist layer according to an exemplary embodiment.

FIG. 11 illustrates developing the photoresist layer to create an opening according to an exemplary embodiment.

FIG. 12 illustrates electrolytically forming a copper pillar within the opening according to an exemplary embodiment.

FIG. 13 illustrates removing a transition region of the photoresist layer according to an exemplary embodiment.

FIG. 14 illustrates electrolytically depositing a first metal layer and a second metal layer on top of the copper pillar according to an exemplary embodiment.

FIG. 15 illustrates electrolytically forming a solder cap above the copper pillar according to an exemplary embodiment.

FIG. 16 illustrates removing the photoresist layer and reflowing the solder cap to form a solder bump according to an exemplary embodiment.

FIG. 17 illustrates an alternative structure according to an exemplary embodiment.

FIG. 18 illustrates an alternative structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
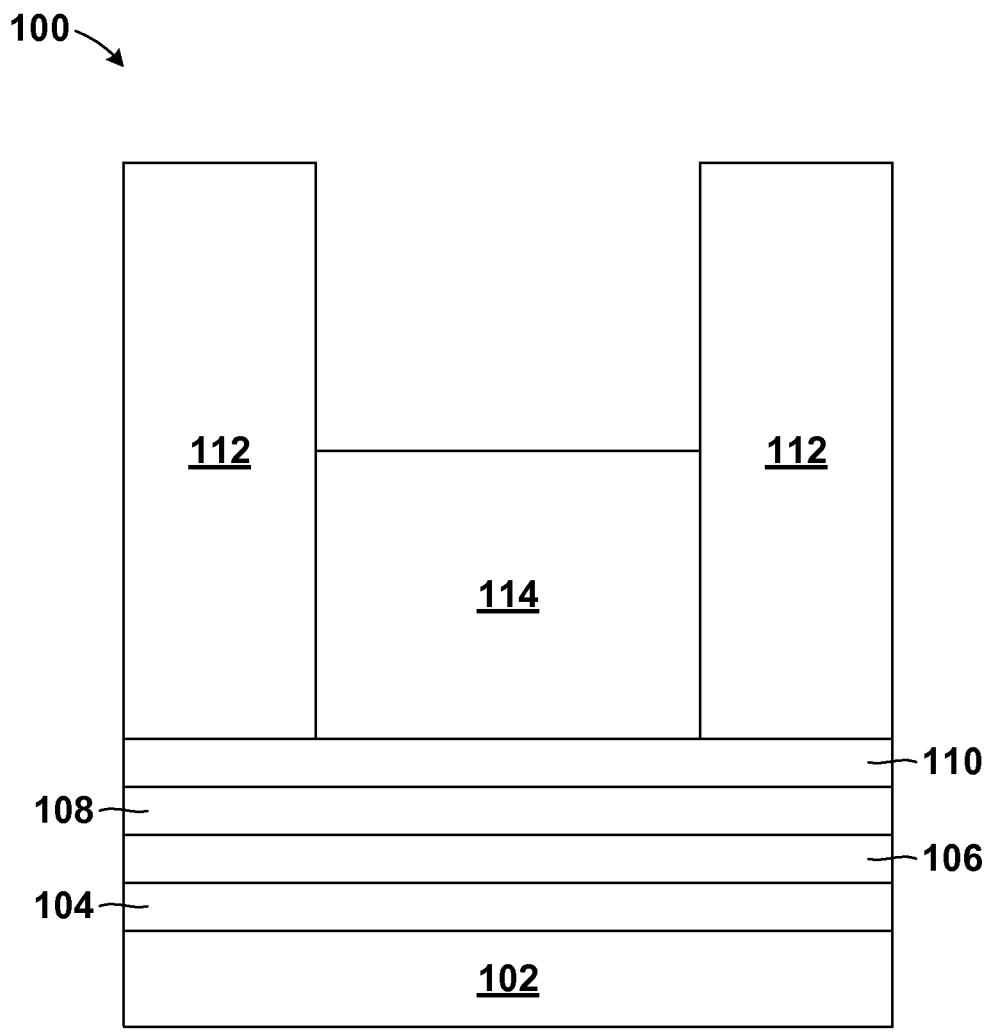
FIGS. 1-9 illustrate modifying the wettability characteristics of a copper pillar using electrodeposition according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor fabrication, and more particularly to the use of electrolytic plating to control solder wettability of a copper pillar. More specifically, solder wettability of a copper pillar structure may be controlled by modifying its surface using one or more electroplated layers. One way to modify the surface of a copper pillar using one or more electroplated layers is described in detail below by referring to the accompanying drawings FIGS. 1-7. Each of the figures is a cross section of a portion of a semiconductor wafer and may illustrate a representative copper pillar, and manufacture thereof, for purposes of the following description.

Referring now to FIG. 1, a structure 100 according to an embodiment of the invention is shown. The structure 100 may include a dielectric layer 102. The dielectric layer 102 may include any dielectric layer in a typical semiconductor structure. In an embodiment, the dielectric layer 102 may be included in a back-end-of-line interconnect level. The dielectric layer 102 may include any type of dielectric material used for insulating conductive features known to a person of ordinary skill in the art including, for example, silicon dioxide, silicon nitride, tetraethyl orthosilicate, or polyimide.

The dielectric layer 102 may be formed above a substrate using a conventional deposition process such as, for example, chemical vapor deposition (CVD), plasma-enhanced CVD, evaporation, spin-on coating or other like deposition process. The dielectric layer 102 may have a thickness ranging from about 0.5 µm to about 10 µm. The thickness of the dielectric layer 102 after deposition may vary and is not critical to the various embodiments of the present invention. It should be noted that the dielectric layer 102, while only depicted as a single layer, may include a plurality of layers.

Next, a stack of layers may then be conformally deposited on top of the structure 100, and more specifically on top of the dielectric layer 102. The stack of layers may alternatively be referred to as a quad layer plating structure. The stack of layers may include a first layer 104, a second layer 106, a third layer 108, and a fourth layer 110. The first layer 104, the second layer 106, the third layer 108, and the fourth layer 110 may each be deposited successively one on top of another. After, depositing the stack of layers, the structure 100 will undergo an electroplating technique used to fill an opening with a conductive interconnect material (hereinafter "interconnect material"), as discussed below.

The first layer 104 may be deposited on top of the dielectric layer 102. It should be noted that the first layer 104, while only depicted as a single layer, may include a plurality of layers. The first layer 104 may include, but is not limited to, tantalum nitride, tantalum, titanium, titanium nitride, tungsten, titanium tungsten, titanium tungsten chrome, ruthenium, cobalt, or any combination of these materials. In an embodiment, the first layer 104 may include a tantalum nitride layer followed by a tantalum layer or vice versa. In another embodiment, the first layer 104 may include a titanium tungsten layer. The first layer 104 may have a total thickness ranging from about 5 nm to about 500 nm, and ranges there between, although a thickness of the first layer 104 less than 5 nm or greater than 500 nm is acceptable. More typically, the first layer 104 may have a thickness ranging from about 50 nm to about 150 nm.

The first layer 104 may be deposited using any suitable deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. In a preferred embodiment, the first layer 104 may be deposited using a sputter deposition technique.

The first layer 104 may serve two purposes, one to provide mechanical adhesion to the dielectric layer 102, and two, to act as a barrier layer. The primary function of the first layer 104 may be to form a mechanical bond between the dielectric layer 102 and a layer subsequently formed above. In doing so, the first layer 104 may provide some amount of mechanical adhesion between the dielectric layer 102 and the second layer 106. As a barrier, the first layer 104 may serve to prevent any subsequently formed or deposited conductive material from diffusing into the dielectric layer 102. It should be noted that the first layer 104 may alternatively be referred to as an adhesion layer.

The total thickness range for the first layer 104, from about 5 nm to about 500 nm, may be significant to subsequent processing steps. The first layer 104 must be sufficiently thick to fully cover the dielectric layer 102. If the first layer 104 is discontinuous this layer may not provide sufficient barrier properties between the dielectric layer 102 and the subsequent second layer 106 which can result in reliability issues. Discontinuities in the first layer 104 can also result in poor adhesion between subsequently added layers. The first layer 104 must be sufficiently thin as to facilitate the eventual removal of a portion of this layer. If the first layer 104 is too thick, removal techniques, such as, wet etching and laser ablation may be affected by etch solution undercut and difficulties fully removing the film, respectively. The first layer 104 must also be sufficiently thin as not to apply stress to the surface of the wafer which may result in wafer bow that makes the wafer difficult to process.

The second layer 106 may be deposited directly on top of the first layer 104, as illustrated. It should be noted that the second layer 106, like the first layer 104, may also include a plurality of layers even though it too is only depicted as a single layer. The second layer 106 may include any low resistance metal suitable for carrying a sufficient electrical current for the subsequent electroplating technique described below. The low resistance metal should be compatible with semiconductor structure fabrication techniques. For example, the second layer 106 may include, but is not limited to, copper (Cu), aluminum (Al), or tungsten (W). In some cases, the second layer 106 may include one or more additives or dopants in addition to the low resistance metal. The additives or dopants may include, such as, for example, manganese (Mn), magnesium (Mg), or combinations thereof. The second layer 106 may have a thickness ranging from about 5 nm to about 1000 nm, and ranges there between, although a thickness of the second layer 106 less than 5 nm or greater than 1000 nm is acceptable. More typically, the second layer 106 may have a thickness ranging from about 100 nm to about 500 nm.

The second layer 106 may be formed using similar techniques as described above with reference to the first layer 104. The second layer 106 may function as a continuous current carrying layer during a subsequent electroplating technique. The second layer 106 may preferably be thick enough to carry a sufficient amount of electrical current to achieve efficient and uniform plating of the interconnect material during the subsequent electroplating technique. It should be noted that the second layer 106 may generally be thicker than the fourth layer 110. To ensure efficient and uniform plating of the interconnect material the thickness of the second layer 106 may preferably be at least about 100 nm. More specifically, the second layer 106 may preferably be at least about 100 nm in order to ensure a sufficient amount of electrical current can be uniformly supplied across the entire structure. The second layer 106 may alternatively be referred to as a current carrying layer.

The total thickness range for the second layer 106, from about 5 nm to about 1000 nm, may be significant to subsequent processing steps. The second layer 106 must be sufficiently thick to fully cover the first layer 104. If the second layer 106 is discontinuous, subsequent electroplating of the interconnect material may be impacted by variations in thickness and/or voids in the plated layer. The second layer 106 must also be thick enough to effectively distribute current across the wafer being plated, such that subsequent electroplating of the interconnect material may occur evenly from the edge to the center of the wafer. The second layer 106 must be sufficiently thin as to facilitate the eventual removal of a portion of this layer. If the second layer 106 is too thick, removal techniques, such as, wet etching and laser ablation may be affected by etch solution undercut and difficulties fully removing the film, respectively. The second layer 106 must also be sufficiently thin as not to apply stress to the surface of the wafer which may result in wafer bow that makes the wafer difficult to process.

The third layer 108 may be deposited directly on top of the second layer 106, as illustrated. Like above, the third layer 108 may also include a plurality of layers even though it too is only depicted as a single layer. The third layer 108 may preferably prohibit or inhibit plating of the conductive material during the subsequent electroplating technique. Therefore, the third layer 108 may be constructed from a material that will not allow plating of the interconnect material during the subsequent electroplating technique. In an embodiment, for example, the third layer 108 may include the same or similar material as the first layer 104 described above. The third layer 108 may have a thickness ranging from about 5 nm to about 500 nm, and ranges there between, although a thickness of the third layer 108 less than 5 nm or greater than 500 nm is acceptable. More typically, the third layer 108 may have a thickness ranging from about 50 nm to about 150 nm. In an embodiment, the third layer 108 may preferably remain above and cover the second layer 106. The third layer 108 may be formed using similar techniques as described above with reference to both the first layer 104 and the second layer 106. It should be noted that the third layer 108 may alternatively be referred to as a plate inhibiting layer.

In some embodiments, it may be preferable to fabricate the first layer 104 and the third layer 108 from identical or near identical materials. For example both the first layer 104 and the third layer 108 may be made from a layer of tantalum nitride and a layer of tantalum, or both may be made from titanium tungsten. In other embodiments, it may be preferable to fabricate the first layer 104 and the third layer 108 from different materials. For example, the first layer 104 can be made from a layer of tantalum nitride and a layer of tantalum, and the third layer 108 can be made from titanium tungsten. In another embodiment, any of the layers in the stack of layers made from a tantalum nitride layer followed by a tantalum layer, may alternatively be made from a titanium tungsten layer followed by a titanium layer or vice versa.

The total thickness range for the third layer 108, from about 5 nm to about 500 nm, may be significant to subsequent processing steps. The third layer 108 must be sufficiently thick as to prevent its removal during a subsequent chemical mechanical polishing technique described below. The third layer 108 must be sufficiently thin as to facilitate the eventual removal, limit wafer bow during subsequent processing, and provide good adhesion to underlying metals. If the third layer 108 is too thick, removal techniques, such as, wet etching and laser ablation may be affected by etch solution undercut and difficulties fully removing the film, respectively. The third layer 108 must also be sufficiently thin as not to apply stress to the surface of the wafer which may result in wafer bow that makes the wafer difficult to process.

The fourth layer 110 may be deposited directly on top of the third layer 108, as illustrated. Like above, the fourth layer 110 may also include a plurality of layers even though it too is only depicted as a single layer. The fourth layer 110 may preferably function as a seed or foundation on which the interconnect material will be subsequently plated and fill the opening. In an embodiment, the fourth layer 110 may be substantially similar to the second layer 106 described above. Generally, the material of the fourth layer 110 may match the interconnect material. For example, if a copper interconnect material will be used, the fourth layer 110 may also preferably be copper. In another embodiment, the fourth layer 110 may include additives and dopants similar to those used in the second layer 106. In some embodiments, the second layer 106 and the fourth layer 110 may include the same or different additives or dopants. In other embodiments, the fourth layer 110 may include one or more additives or dopants even though the second layer 106 may include none or vice versa. The fourth layer 110 may have a thickness ranging from about 5 nm to about 1000 nm, and ranges there between, although a thickness of the fourth layer 110 less than 5 nm or greater than 1000 nm is acceptable. More typically, the fourth layer 110 may have a thickness ranging from about 200 nm to about 500 nm. The fourth layer 110 may alternatively be referred to as a plate supporting layer or plate promoting layer.

The total thickness range for the fourth layer 110, from about 5 nm to about 1000 nm, may be significant to subsequent processing steps. If the fourth layer 110 is discontinuous, subsequent electroplating of the interconnect material may be impacted by variations in thickness and/or voids in the plated layer. The fourth layer 110 must be sufficiently thin as to minimize the cost of CMP processing, limit wafer bow during subsequent processing, provide good adhesion to underlying metals, and minimize dishing. It should be noted that all the layers (104, 106, 108, 110) are conductive and in direct contact with one another, as illustrated in the figures.

Figure 2:
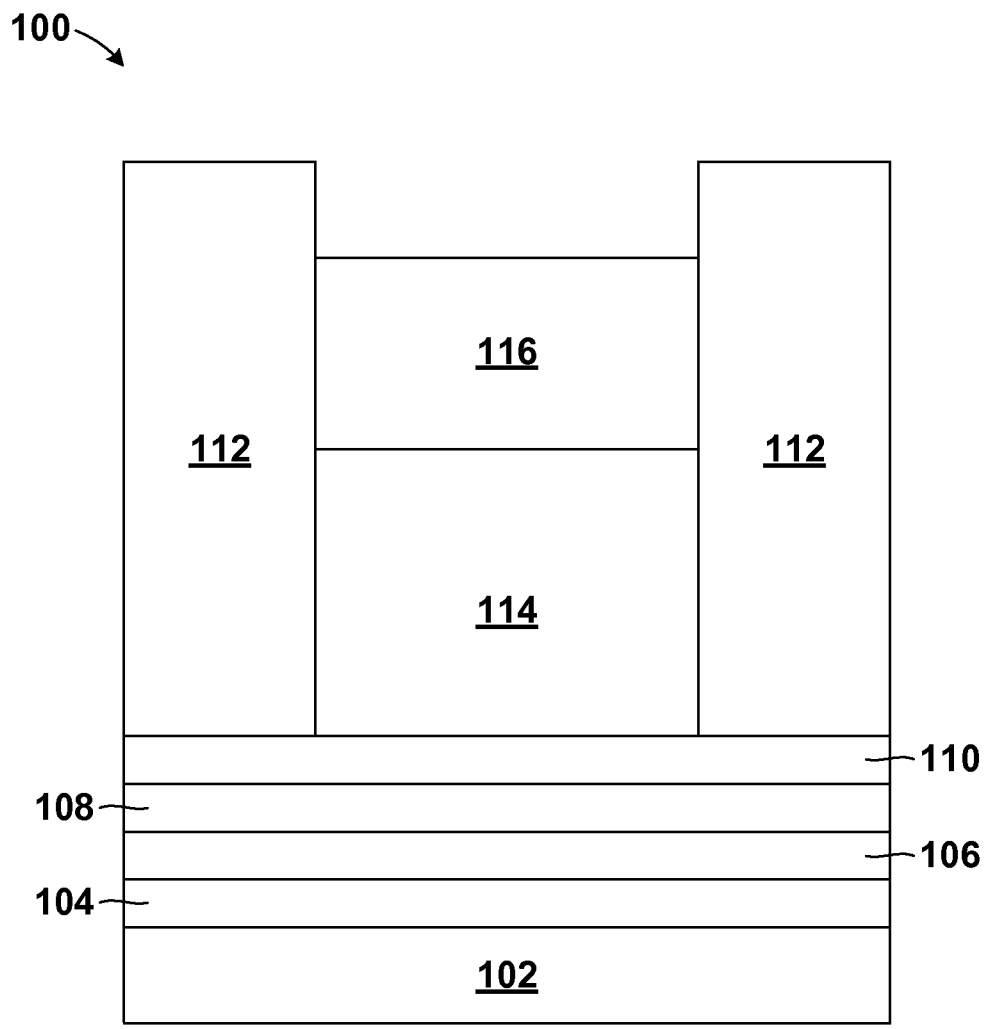

With continued reference to FIG. 1, a photoresist material 112 may then be deposited on the fourth layer 110 using conventional deposition techniques such as, for example, dry film lamination or spin on liquid resist. The photoresist material 112 may then be subjected to conventional lithographic and etching processes to form an opening. Thereafter, the opening may be substantially filled with the interconnect material to form a copper pillar 114. The opening may be substantially filled with the conductive interconnect material using an electroplating technique as referenced above. It should be noted that the interconnect material of the copper pillar 114 illustrated in FIG. 2 is the same interconnect material as referenced above. Standard electroplating techniques known in the art may be performed to fill the opening and form the copper pillar 114. In the present embodiment the interconnect material may include, for example, copper. In an embodiment, the interconnect material may include additives and dopants similar to those used in the second layer 106. In some embodiments, the fourth layer 110 and the interconnect material may include the same or different additives or dopants. In other embodiments, the fourth layer 110 may include one or more additives or dopants even though the interconnect material may include none, or vice versa.

In most cases, the electroplating technique may result in some amount of the interconnect material extending above and outside the opening as excess or overburden. In such cases, another chemical mechanical polishing technique may be used to remove the excess or overburden interconnect material to form the final copper pillar 114, as illustrated in the figure.

In the present embodiment the stack of layers may together function as a cathode for the electroplating technique. More specifically, the fourth layer 110, exposed at a bottom of the opening, may function as the cathode or the surface to be plated, and an electrical bias, electrical potential, or negative voltage may be applied to the fourth layer 110 by way of the second and third layers 106, 108. The second layer 106 may be used as the current carrying layer in which to supply the fourth layer 110 or cathode with the necessary electrical current, hence the reason for describing the stack of layers together as the cathode. In addition to prohibiting plating, the third layer 108 may conduct the electrical current from the second layer 106 to the fourth layer 110. In an embodiment, the electrical current may be applied to the second layer 106 at or near an outermost edge of the structure 100. More specifically, the electrical current may be directly applied to the third layer 108 which is conductive and in direct contact with the second layer 106.

While performing the electroplating technique, only a portion of the fourth layer 110 exposed at the bottom of the opening may be in direct contact with an electrolyte solution upon which the interconnect material (e.g., copper) suspended in the electrolyte solution can deposit or plate out on the fourth layer 110 and substantially fill the opening. If ever the third layer 108 comes in direct contact with the electrolyte solution, the interconnect material suspended in the electrolyte solution does not deposit or does not plate out on the third layer 108, as mentioned above. The electrolyte solution may include, but is not limited to, copper sulfate ($CuSO_4$) or sulfuric acid ($H_2SO_4$). The electroplating technique may be performed until the interconnect material (e.g., copper) from the electrolyte solution overfills and extends outside of the top of the opening, as mentioned above. A polishing technique (not shown) may optionally be used to remove any excess interconnect material extending above the top of the opening, also as mentioned above.

It should be noted that the thickness of the second layer 106, or current carrying layer, may affect the plating process. As discussed above, a thicker layer may produce more uniform plating across an entire structure, and similarly, a relatively thin current carrying layer may detrimentally impact plating uniformity across the entire structure.

In an embodiment, the copper pillar 114 may have a width or diameter ranging from about 5 µm to about 150 µm, and a height ranging from about 10 µm to about 80 µm. In one embodiment, the copper pillar 114 may be about 40 µm tall, and about 40 µm wide.

Referring now to FIG. 2, a solder cap 116 may be plated to a top surface of the copper pillar 114 according to known plating techniques, or alternatively by known C4NP techniques. In one embodiment, the solder cap 116 may be, about 2 µm to about 30 µm in diameter and as such may generally match the diameter of the copper pillar 114. It should be noted that the solder cap 116 can wet only to the top surface of the copper pillar 114 and cannot wet the sidewall of the copper pillar 114 as the sidewall remains covered by the photoresist 112. The height of the solder cap 116 may be driven by the desired amount of solder to achieve a suitable connection.

Figure 3:
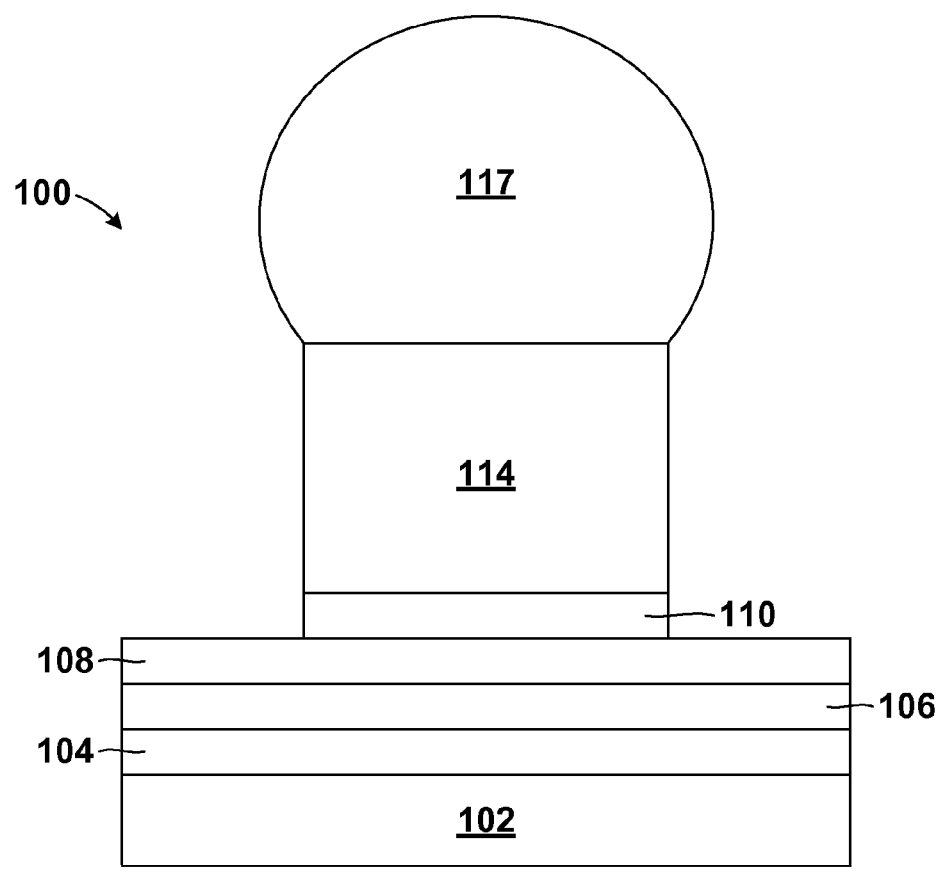

Referring now to FIG. 3, the photoresist 112 is removed and structure 100 may undergo heating to reflow the solder cap 116. The photoresist 112 may be removed or stripped using known techniques and typical strippers. For example, the photoresist 112 can be removed using TMAH with a high pH content, with glycol to assist in swelling and NMP to aid in dissolution. Alternatively, the photoresist 112 can be stripped using sodium or potassium hydroxide. Next, the structure 100 may be heated to cause the solder cap 116 to reflow and create a solder bump 117. In one embodiment, a low temperature solder paste may be heated to melt in a reflow furnace and then cooled down to form their shapes according to their surface. It should be noted that the surface tension of the molten solder may define the spherical or hemispherical shape of the solder bump 117. Furthermore, the surface tension of the molten solder may restrict or limit the molten solder from extending of flowing beyond an outer edge of the top surface of the copper pillar 114.

Next, a first portion of the fourth layer 110 exposed by the removal the photoresist 112 may be removed selective to the third layer 108 according to known techniques. More specifically, the first portion of the fourth layer 110 that is not covered by the copper pillar 114 may be selectively removed without substantially removing any of the third layer 108. For example, dry etching (e.g. RIE), wet etching, or laser ablation may be used to remove the first portion of the fourth layer 110. Therefore, a second portion of the fourth layer 110 may remain beneath the copper pillar 114, as illustrated. It should be noted that a sidewall of the second portion of the fourth layer 110 may remain exposed after removal of the first portion.

Figure 4:
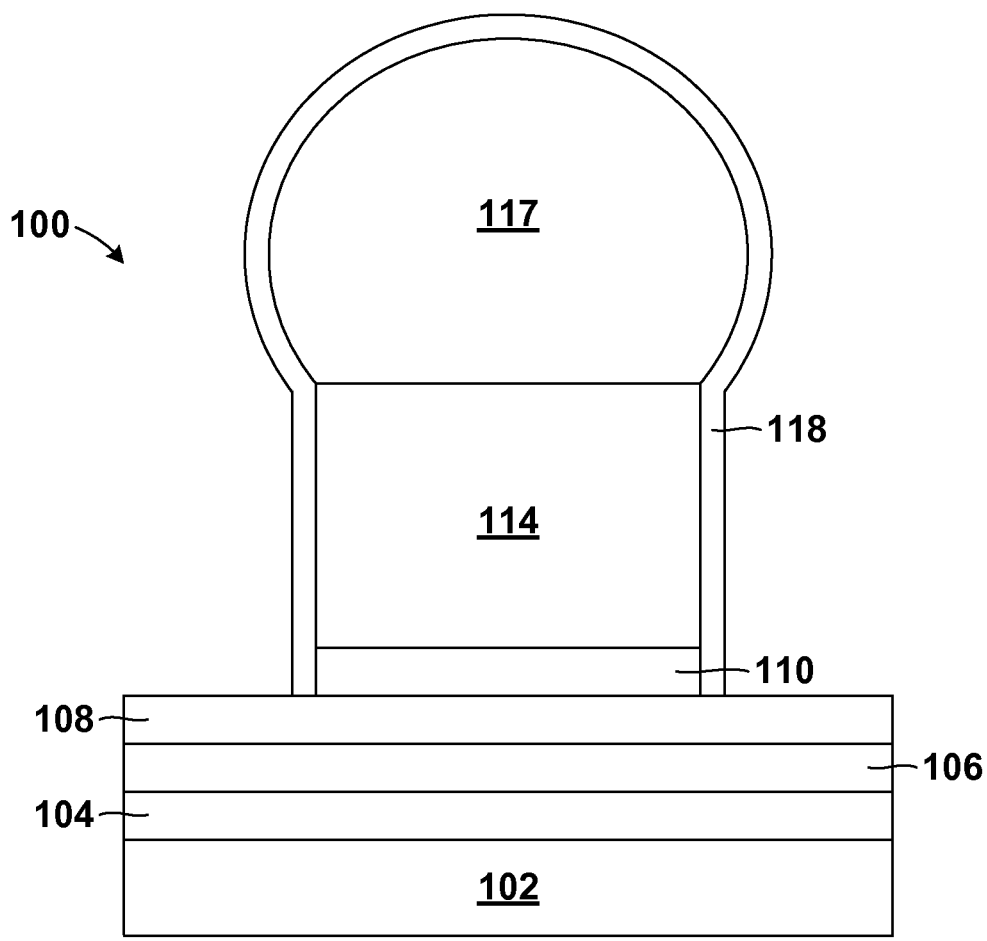

Referring now to FIG. 4, a metal layer 118 may be electrolytically deposited on top of the solder bump 117, along the sidewall of the copper pillar 114, and along the sidewall of the fourth layer 110, as illustrated. The metal layer 118 may be applied specifically to impact or change the wettability properties of the copper pillar 114, specifically, the wettability of the sidewall of the copper pillar 114. The material of the metal layer 118 may be chosen specifically to either improve or deteriorate the solder wettability of the sidewall of the copper pillar 114.

In an embodiment, the metal layer 118 may include a material which intentionally deteriorates the solder wettability characteristics of the sidewall of the copper pillar 114, such as for example, tin. The metal layer 118 of the present embodiment may be applied relatively thin using known electroplating techniques. In particular, the tin metal layer 118 may have a thickness ranging from about 0.1 µm to about 1.0 µm. In order to achieve the desired non-wettable characteristics, the thickness of the tin should be less about 1.0 µm in order to form a copper-tin ($Cu_3Sn$) intermetallic 120 along the sidewall of the copper pillar 114. If the tin metal layer 118 is thicker than about 1.0 µm the tin metal layer 118 won't fully convert to $Cu_3Sn$ and instead may form $Cu_6Sn_5$ intermetallic which may have an opposite effect on the wettability than desired. The $Cu_6Sn_5$ may actually improve the wettability of the sidewall of the copper pillar 114. Alternatively, if the desired result is to improve wettability characteristics, the $Cu_6Sn_5$ intermetallic may be formed intentionally using a relatively thick layer of tin. The copper-tin ($Cu_3Sn$) intermetallic 120 may generally form at room temperature; however, known low temperature heating techniques may be used to force the reaction, and ensure the entire tin metal layer 118 is consumed.

Figure 5:
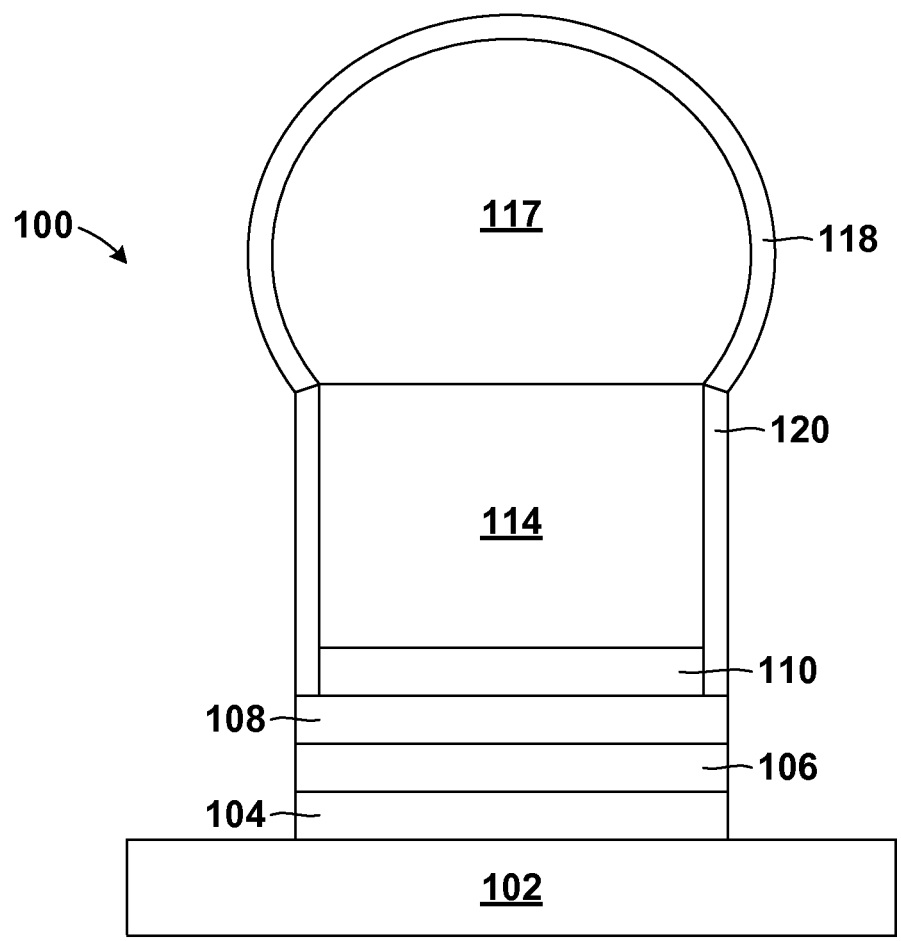

Referring now to FIG. 5, the structure 100 may be heated in a reducing environment to cause an entire thickness of the tin metal layer 118 to fully react with the copper to form the copper-tin ($Cu_3Sn$) intermetallic 120. In general the copper-tin ($Cu_3Sn$) intermetallic may have poor wettability characteristics and may generally be referred to as a non-wettable barrier layer. The present heating technique uses temperatures low enough to prevent the solder bump 117 from melting, but high enough to force the reaction and formation of the desired intermetallic between the tin and the copper. It should be noted that the copper-tin ($Cu_3Sn$) intermetallic 120 may also form along an exposed sidewall of the fourth layer 110 extending down to, and contacting, the third layer 108.

According to another embodiment, the tin metal layer 118 of FIG. 4 may alternatively be heated in a non-reducing environment or an oxidizing environment. Doing so, may cause the tin metal layer 118 to oxidize. In general, an oxidized metal surface may have poor wettability characteristics which may be used to further tailor the wettability of the copper pillar 114. In such cases, after heating, the tin metal layer 118 may include one or more layers having different compositions, such as, for example, copper-tin ($Cu_3Sn$), tin, and tin-oxide ($SnO_2$), in order. As above, the copper-tin ($Cu_3Sn$) intermetallic 120 will only form along the sidewall of the copper pillar 114, limiting the tin metal layer 118 above the solder bump 117 to some combination of tin and tin-oxide. The presence of an oxidized metal having poor wettability properties/characteristics may need to be removed from above the solder bump 117 before the final reflow.

According to another embodiment, similar techniques, as described above, may also be used to form a non-wettable nickel-oxide (NiO) from a nickel metal layer (118).

Furthermore, a portion of the tin metal layer 118 may remain unchanged and in contact with the solder bump 117 during the low temperature heating. The tin metal layer 118 in contact with the solder bump 117 does not oxidize due to the low temperature heating in the reducing environment. Oxidation of the remaining tin metal layer 118 in contact with the solder bump 117 may detrimentally affect the subsequent wettability of the solder bump 117, and as such may require additional process steps to achieve superior wettability characteristics.

At the present step, the interconnect material of multiple features across a wafer may remain electrically connected through the second layer 106. Therefore, after plating the interconnect material of the copper pillar 114, portions of the stack of layers, for example the first, the second, and the third layers 104, 106, 108, may be removed from the structure 100 to purposefully break any electrical connection between multiple features across the wafer. To that end, the portion of the stack of layers may preferably be removed from areas of the structure 100 unrelated to the conductive feature. Stated differently, the portion of the stack of layers may preferably be removed from the structure 100 everywhere there is not a conductive feature, for example, the copper pillar 114.

The portion of the stack of layers may be removed from the structure 100, as illustrated, using a variety of removal techniques. The portion of the stack of layers may be removed in multiple steps, one or two layers at a time, or in a single step. The portion of the stack of layers may be removed using any one of a variety of removal techniques, such as, for example, chemical mechanical polishing, dry etching (e.g. RIE), wet etching, or laser ablation.

Figure 6:
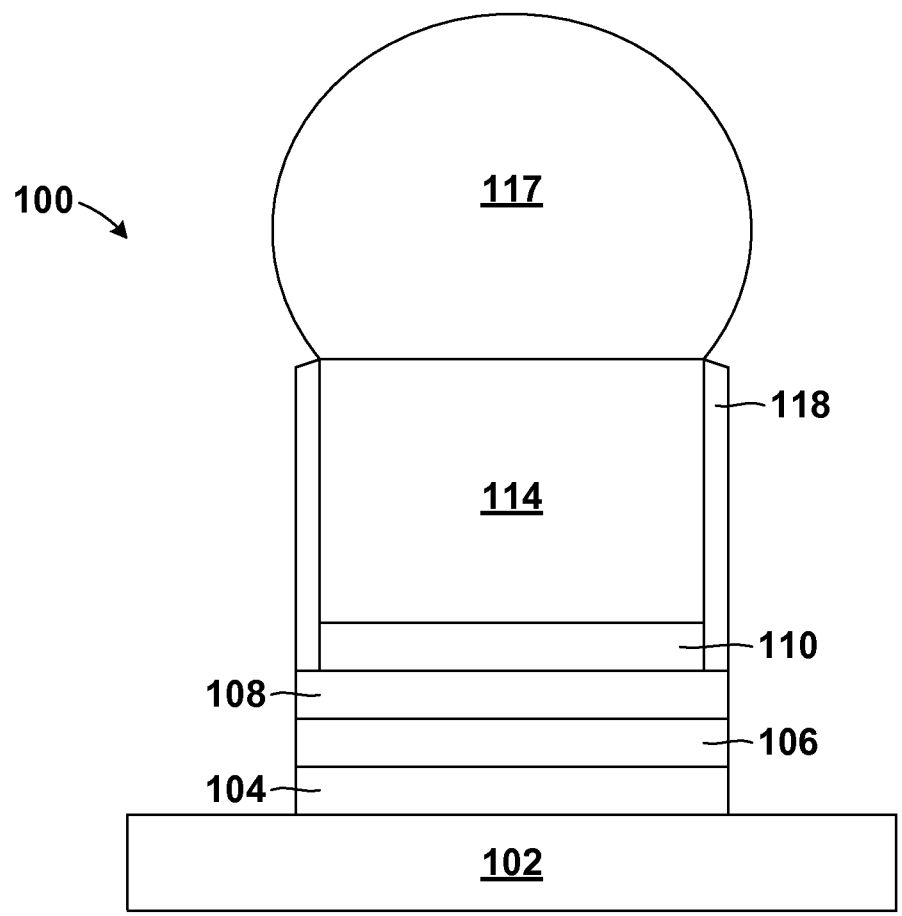

Referring now to FIG. 6, after low temperature heating described above, the structure 100 may be heated again at a temperature sufficient to reflow the solder bump 117 to form a final structure 100. It should be noted that the unreacted tin metal layer 118 remaining on the surface of the solder bump 117 may be pulled into the solder bump 117 during reflow. Therefore, the final structure 100 may include a non-wettable barrier layer, namely the copper-tin ($Cu_3Sn$) intermetallic 120 along only the sidewall of the copper pillar 114 which may prevent solder from the solder bump 117 from wetting during a subsequent flip-chip assembly process. Uniformity of flip chip assemblies may be achieved by limiting the solder wettability to only the top surface of the copper pillar 114, in turn producing stronger and more reliable chip packages. Also, it should be noted that reflowing the solder bump 117, as in FIG. 3, prior to plating the metal layer 118, as in FIG. 4, may be important to avoid solder voids. If the metal layer 118 is plated on top of the solder bump 117 before reflowing, it may trap unwanted gases in the solder bump 117 which may cause voids to form and lead to poor reliability of the final solder connection.

Figure 7:
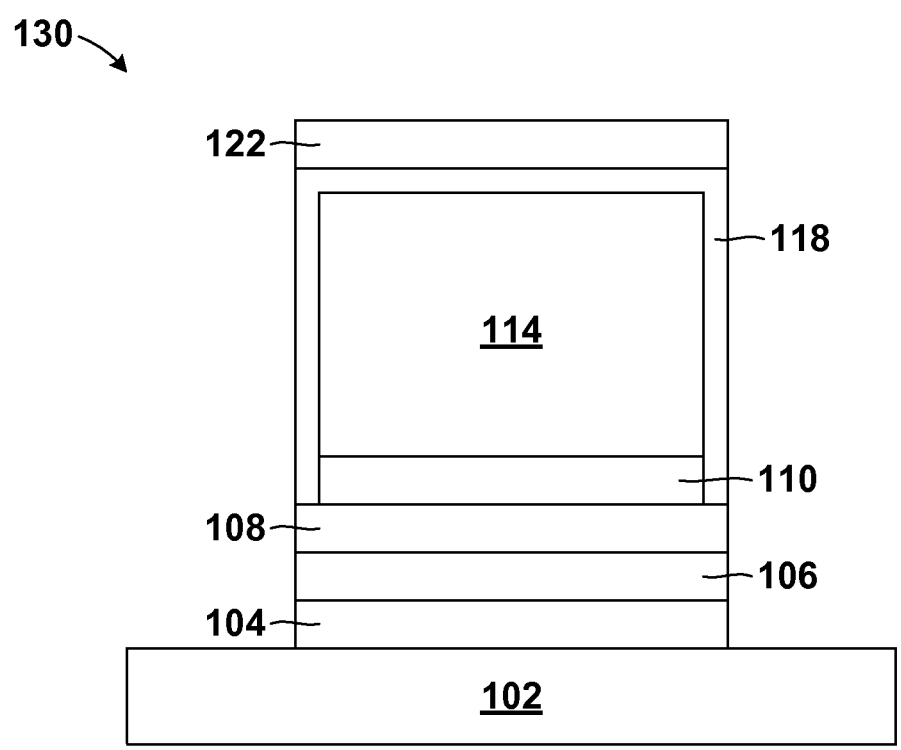

Referring now to FIG. 7, an alternative structure 130 according to the above embodiment is shown. The structure 130 may represent a copper pillar interconnect structure similar to the structure 100 but without a solder bump. In the present example, the metal layer 118 may be electrolytically deposited directly on a top surface in addition to the sidewall of the copper pillar 114. In other words, the metal layer 118 may conformally surround the copper pillar 114. The metal layer 118 of the present embodiment may include either tin or nickel and generate a non-wettable surface as described in detail above with reference to FIG. 4.

Next, a metal cap 122 may be formed on top of the copper pillar 114 in direct contact with a portion of the metal layer 118. More particularly, the metal cap 122 may be deposited on the copper pillar 114 using, for example, another plating bath. The metal cap 122 may provide a wettable surface for the solder used in a flip chip assembly. Solder may be deposited or plated directly on the metal cap 122 before flip chip assembly, or alternatively, solder may be provided on a mating surface opposite the metal cap 122 in the flip chip assembly. The metal cap 122 may include any palatable metal providing good solder wettability characteristics. For example, the metal cap 122 may include gold, palladium, or some combination thereof. The metal cap 122 may have a thickness ranging from about 0.05 µm to about 1.0 µm.

Figure 8:
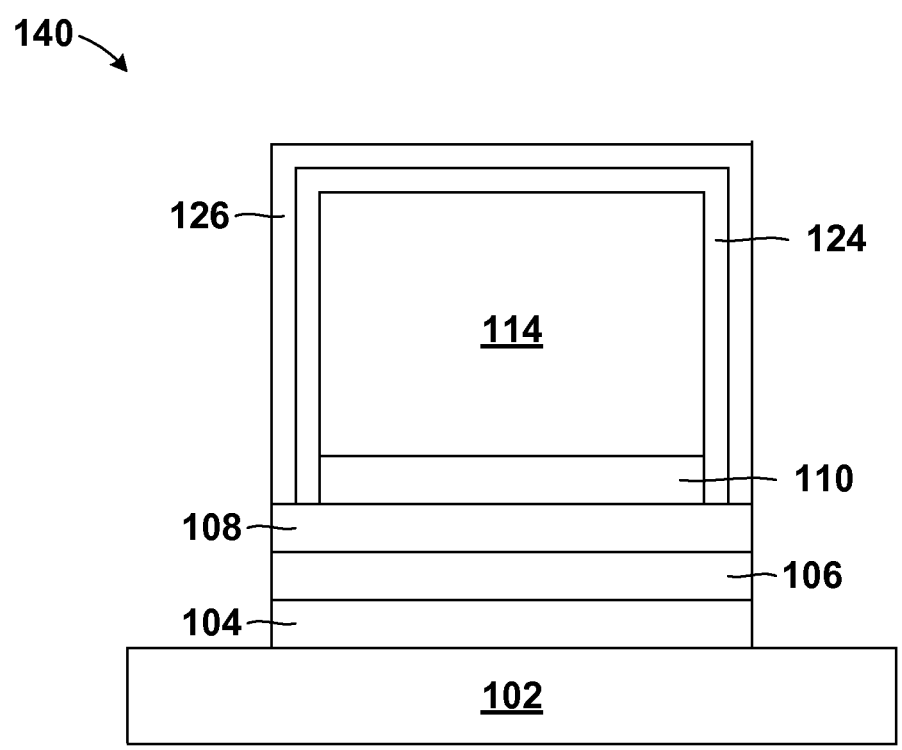

Referring now to FIG. 8, an alternative structure 140 according to the above embodiment is shown. The structure 140 may represent a fully wettable copper pillar interconnect structure without a solder bump. In such cases, one or more metal layers, for example a first layer 124 followed by a second layer 126 may be electrolytically deposited, in order, on the copper pillar 114. In one embodiment, the first layer 124 may be nickel and the second layer 126 may be gold or palladium. The first layer 124 may be used to improve adhesion between the copper pillar 114 and the second layer 126. More specifically, a thin layer of nickel may be plated first to provide improved adhesion for the subsequent plating of the gold or palladium, and each layer need only be thick enough to fully coat the surface of the copper pillar 114. As referenced above, the gold and palladium may be used specifically to provide good solder wettability characteristics. In the present example, the second layer 126 may be conformally plated on both the top and sidewall of the copper pillar 114 to create a fully wettable copper pillar 114.

Another embodiment by which to modify the surface of the copper pillar 114 using one or more electroplated layers is described in detail below by referring to the accompanying drawings FIGS. 9-16. Each of the figures is a cross section of a portion of a semiconductor wafer and may illustrate a representative copper pillar, and manufacture thereof, for purposes of the following description.

Figure 9:
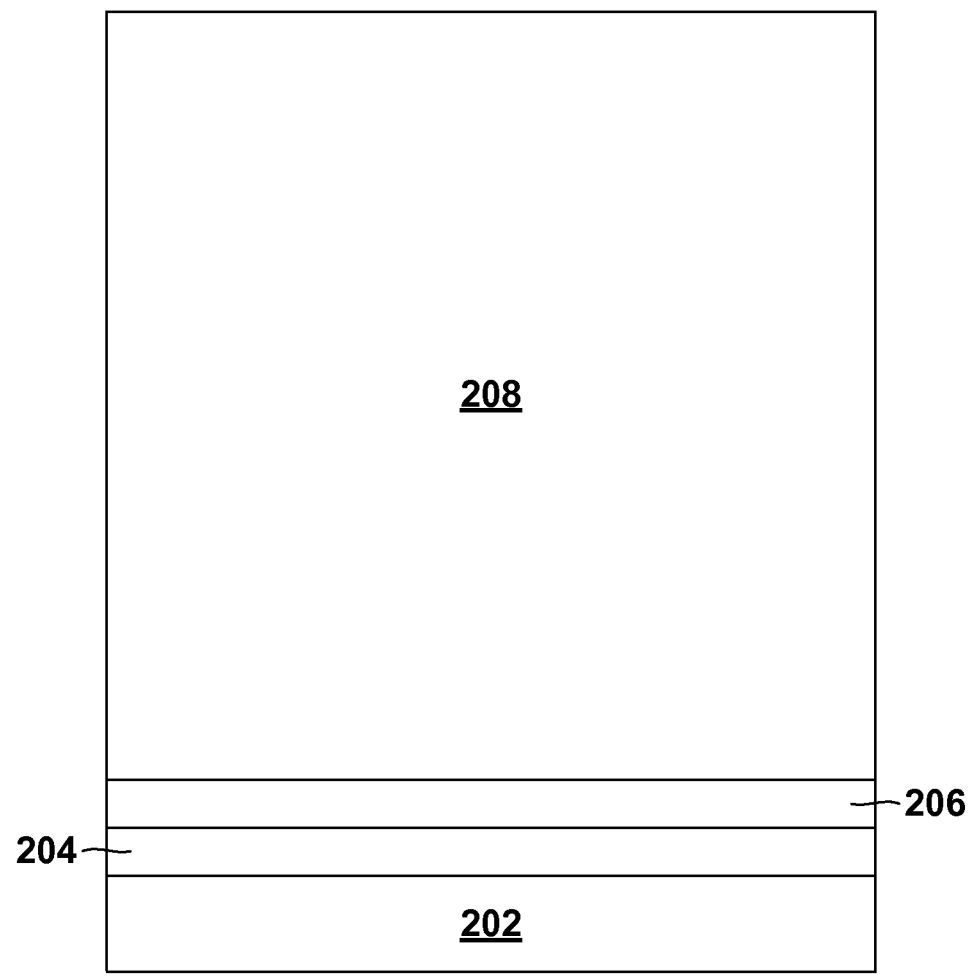

Referring now to FIG. 9, a structure 200 according to an embodiment of the invention is shown. The structure 200 may include a dielectric layer 202. The dielectric layer 202 may include any dielectric layer in a typical semiconductor structure. In an embodiment, the dielectric layer 202 may be included in a back-end-of-line interconnect level. The dielectric layer 202 may include any type of dielectric material used for insulating conductive features known to a person of ordinary skill in the art including, for example, silicon dioxide, silicon nitride, tetraethyl orthosilicate, or polyimide.

The dielectric layer 202 may be formed above a substrate using a conventional deposition process such as, for example, chemical vapor deposition (CVD), plasma-enhanced CVD, evaporation, spin-on coating or other like deposition process. The dielectric layer 202 may have a thickness ranging from about 0.5 µm to about 10 µm. The thickness of the dielectric layer 202 after deposition may vary and is not critical to the various embodiments of the present invention. It should be noted that the dielectric layer 202, while only depicted as a single layer, may include a plurality of layers.

Next, a stack of layers may then be conformally deposited on top of the structure 200, and more specifically on top of the dielectric layer 202, according to known techniques. The stack of layers may include a first layer 204 and a second layer 206. The first layer 204 and the second layer 206 may each be deposited successively one on top of another. After, depositing the stack of layers, the structure 200 will undergo an electroplating technique used to fill an opening with a conductive interconnect material (hereinafter "interconnect material"), as discussed below.

The first layer 204 may be deposited on top of the dielectric layer 202. It should be noted that the first layer 204, while only depicted as a single layer, may include a plurality of layers. The first layer 204 may include, but is not limited to, tantalum nitride, tantalum, titanium, titanium nitride, tungsten, titanium tungsten, titanium tungsten chrome, ruthenium, cobalt, or any combination of these materials. In an embodiment, the first layer 204 may include a tantalum nitride layer followed by a tantalum layer or vice versa. In another embodiment, the first layer 204 may include a titanium tungsten layer. The first layer 204 may have a total thickness ranging from about 5 nm to about 500 nm, and ranges there between, although a thickness of the first layer 204 less than 5 nm or greater than 500 nm is acceptable. More typically, the first layer 204 may have a thickness ranging from about 50 nm to about 150 nm.

The first layer 204 may be deposited using any suitable deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. In a preferred embodiment, the first layer 204 may be deposited using a sputter deposition technique.

The first layer 204 may serve two purposes, one to provide mechanical adhesion to the dielectric layer 202, and two, to act as a barrier layer. The primary function of the first layer 204 may be to form a mechanical bond between the dielectric layer 202 and a layer subsequently formed above. In doing so, the first layer 204 may provide some amount of mechanical adhesion between the dielectric layer 202 and the second layer 206. As a barrier, the first layer 204 may serve to prevent any subsequently formed or deposited conductive material from diffusing into the dielectric layer 202. It should be noted that the first layer 204 may alternatively be referred to as an adhesion layer.

The total thickness range for the first layer 204, from about 5 nm to about 500 nm, may be significant to subsequent processing steps. The first layer 204 must be sufficiently thick to fully cover the dielectric layer 202. If the first layer 204 is discontinuous this layer may not provide sufficient barrier properties between the dielectric layer 202 and the subsequent second layer 206 which can result in reliability issues. Discontinuities in the first layer 204 can also result in poor adhesion between subsequently added layers. The first layer 204 must be sufficiently thin as to facilitate the eventual removal of a portion of this layer. If the first layer 204 is too thick, removal techniques, such as, wet etching and laser ablation may be affected by etch solution undercut and difficulties fully removing the film, respectively. The first layer 204 must also be sufficiently thin as not to apply stress to the surface of the wafer which may result in wafer bow that makes the wafer difficult to process.

The second layer 206 may be deposited directly on top of the first layer 204, as illustrated. It should be noted that the second layer 206, like the first layer 204, may also include a plurality of layers even though it too is only depicted as a single layer. The second layer 206 may include any low resistance metal suitable for carrying a sufficient electrical current for the subsequent electroplating technique described below. The low resistance metal should be compatible with semiconductor structure fabrication techniques. For example, the second layer 206 may include, but is not limited to, copper (Cu), aluminum (Al), or tungsten (W). In general, the material of the second layer 206 may match the interconnect material. For example, if a copper interconnect material will be used, the second layer 206 may also preferably be copper. In some cases, the second layer 206 may include one or more additives or dopants in addition to the low resistance metal. The additives or dopants may include, such as, for example, manganese (Mn), magnesium (Mg), or combinations thereof. The second layer 206 may have a thickness ranging from about 5 nm to about 1000 nm, and ranges there between, although a thickness of the second layer 206 less than 5 nm or greater than 1000 nm is acceptable. More typically, the second layer 206 may have a thickness ranging from about 100 nm to about 500 nm.

The second layer 206 may be formed using similar techniques as described above with reference to the first layer 204. The second layer 206 may function as a seed or foundation on which the interconnect material will be subsequently plated and fill the opening. In addition, the second layer 206 may function as a continuous current carrying layer during a subsequent electroplating technique. The second layer 206 may preferably be thick enough to carry a sufficient amount of electrical current to achieve efficient and uniform plating of the interconnect material during the subsequent electroplating technique. To ensure efficient and uniform plating of the interconnect material the thickness of the second layer 206 may preferably be at least about 100 nm. More specifically, the second layer 206 may preferably be at least about 100 nm in order to ensure a sufficient amount of electrical current can be uniformly supplied across the entire structure.

With continued reference to FIG. 9, a photoresist material 208 may then be deposited on the second layer 206 using conventional deposition techniques such as, for example, dry film lamination or spin on liquid resist. The photoresist material 208 may then be subjected to conventional lithographic patterning and etching processes to form an opening, described in further detail below.

Figure 10:
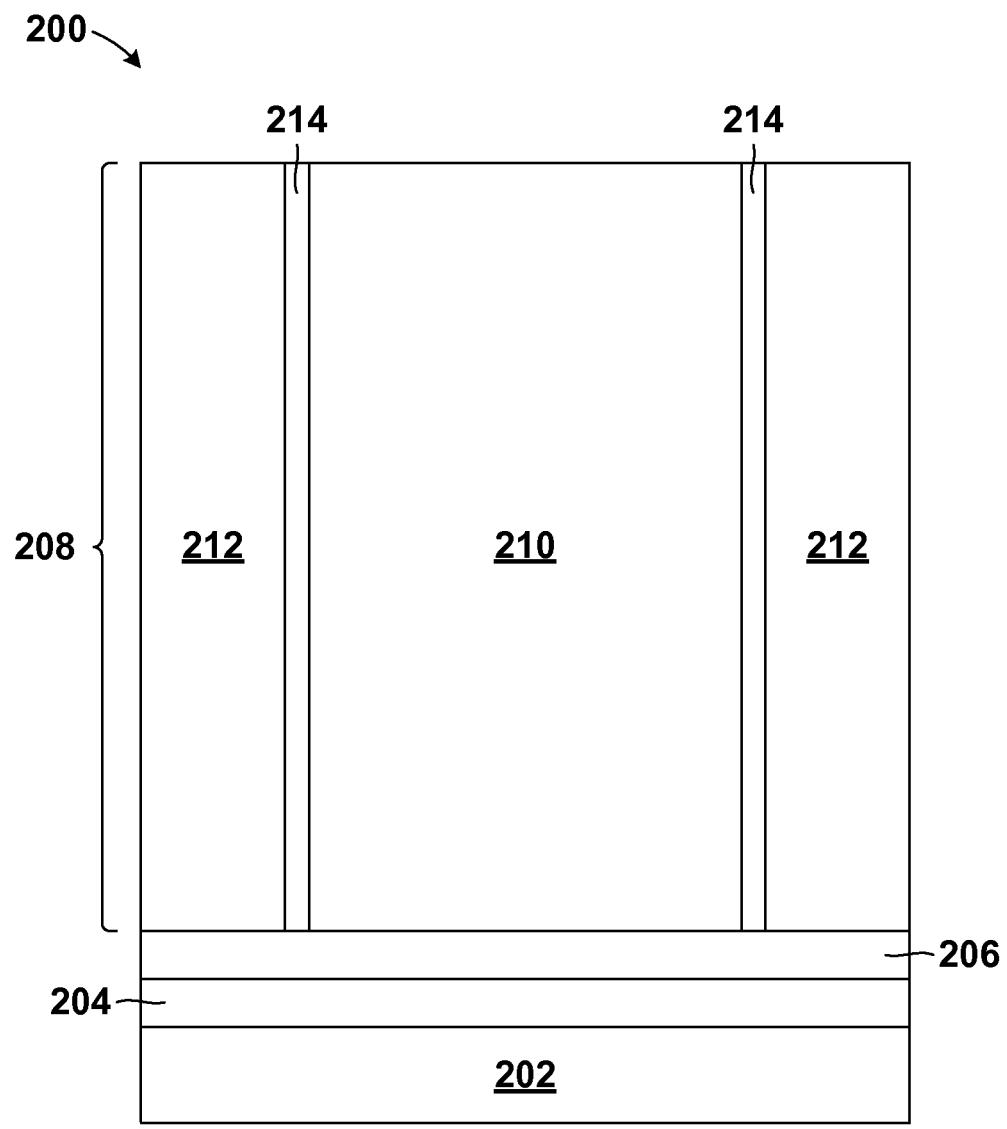

Referring now to FIG. 10, a first portion 210 of the photoresist 208 may be exposed while a second portion 212 of the photoresist 208 may be masked. The exposed portion and the masked portion may be selected based on the design and the tone of the photoresist. In an embodiment, the first portion 210 may be masked and the second portion 212 may be exposed according to known techniques. During exposure of the first portion 210, a transition region 214 may form between the first portion 210 of the photoresist 208 and the second portion 212 of the photoresist 208. The transition region 214 of the photoresist 208 may include a border between fully cross linked portions and non-fully cross linked portions of the photoresist 208 during patterning. Stated differently, the transition region 214 may include a portion of the photoresist 208 that is neither fully cross linked nor completely non-cross linked. Because the transition region 214 may include a portion of the photoresist 208 that is partially cross linked, it may generally remain intact after patterning and development of the photoresist 208.

Figure 11:
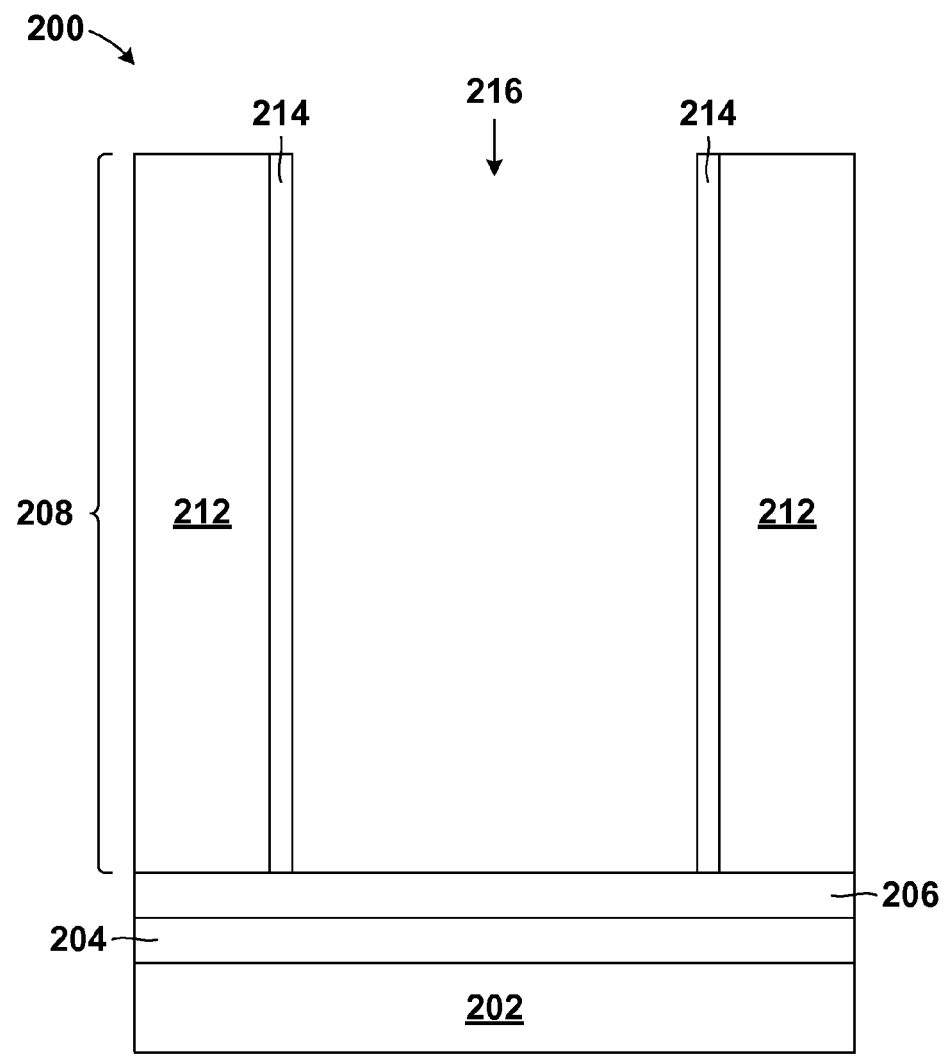

Referring now to FIG. 11, the photoresist 208 may be developed in which the first portion 210 may be removed to create an opening 216. In an embodiment, the structure 200 may undergo typical development in a high pH solution at room temperature (i.e. temperatures ranging from about 20° C. to about 30° C.) for approximately less than 1 minute. For example, the high pH solution may include $K_2Co_3$ or TMAH. It should be noted that the transition region 214 of the photoresist 208 may substantially remain during development and removal of the first portion 210.

Figure 12:
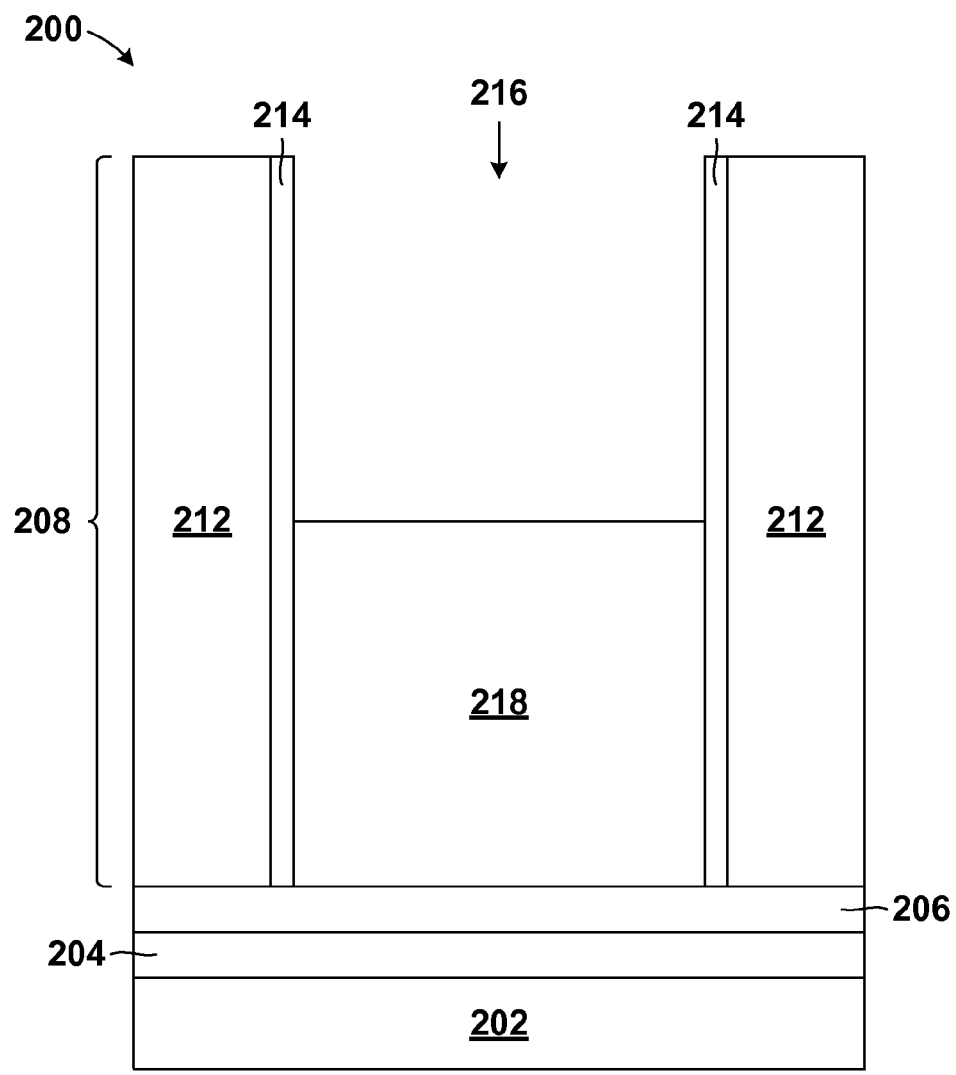

Referring now to FIG. 12, the opening 216 may then be substantially filled with the interconnect material to form a copper pillar 218. The opening may be substantially filled with the conductive interconnect material using the electroplating technique referenced above. It should be noted that the interconnect material of the copper pillar 218 illustrated in FIG. 7 is the same interconnect material as referenced above. Standard electroplating techniques known in the art may be performed to fill the opening and form the copper pillar 218. In the present embodiment the interconnect material may include, for example, copper. In an embodiment, the interconnect material may include additives and dopants similar to those used in the second layer 206.

In most cases, the electroplating technique may result in some amount of the interconnect material extending above and outside the opening as excess or overburden. In such cases, another chemical mechanical polishing technique may be used to remove the excess or overburden interconnect material to form the final copper pillar 218, as illustrated in the figure.

While performing the electroplating technique, only a portion of the second layer 206 exposed at the bottom of the opening may be in direct contact with an electrolyte solution upon which the interconnect material (e.g., copper) suspended in the electrolyte solution can deposit or plate out on the second layer 206 and substantially fill the opening. The electrolyte solution may include, but is not limited to, copper sulfate ($CuSO_4$) or sulfuric acid ($H_2SO_4$). The electroplating technique may be performed until the interconnect material (e.g., copper) from the electrolyte solution overfills and extends outside of the top of opening, as mentioned above. A polishing technique (not shown) may optionally be used to remove any excess interconnect material extending above the top of the opening, also as mentioned above.

In an embodiment, the copper pillar 218 may have a width or diameter ranging from about 5 µm to about 150 µm, and a height ranging from about 10 µm to about 80 µm. In one embodiment, the copper pillar 218 may be about 40 µm tall, and about 40 µm wide.

Next, an optional metal cap (not shown) may be formed on the copper pillar 218. More particularly, the metal cap may be deposited on the copper pillar 218 using, for example, another plating bath. In embodiments, the metal cap may provide a wettable surface for the solder. In embodiments in which a C4NP process is used to subsequently deposit solder, the metal cap may be gold. In embodiments in which a solder plating technique is used to subsequently deposit solder, the metal cap may be omitted. If present, the metal cap may have a thickness ranging from about 0.05 µm to about 1.0 µm.

Figure 13:
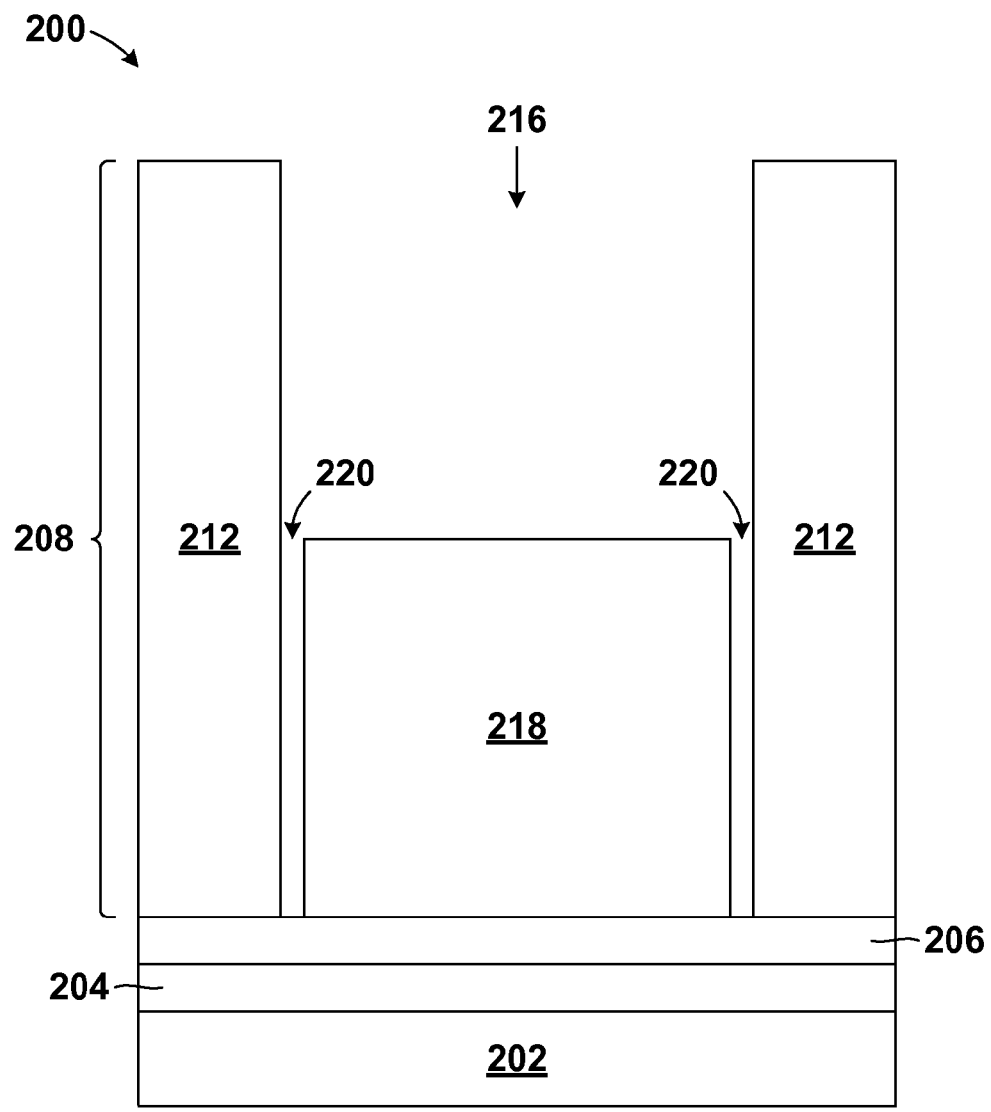

Referring now to FIG. 13, before completely removing the photoresist 208, the structure 200 may be soaked in a high temperature high pH bath to remove the transition region 214 of the photoresist 208 immediately bordering the copper pillar 218. More specifically, a space 220 may be formed between the copper pillar 218 and the photoresist 208 when the transition region 214 of the photoresist 208 is exposed to a high temperature high pH bath. The transition region 214 is only partially cross linked due to partial exposure occurring as light passes by the openings in the expose mask reducing the full dose in this location as compared to the bulk of what the photoresist receives or doesn't receive in the case of positive resist during patterning. Thus, it may be particularly susceptible to removal in a high temperature and/or high pH solution. Typically, the space 220 may have a width ranging from about 0.1 μm to about 1 μm. In general, any solution with a stable high pH and a temperature above room temperature may be used to remove the transition region 214 of the photoresist 208 and create the space 220. In one embodiment, temperatures of the high pH solution may be as high as about 60° C.

It should be noted that the transition region 214 of the photoresist 208 may not be removed in the previously described development step due to the relatively short development time, the room temperature solution, or both. Whereas, in the present step, the development time may be longer than the previous step and the temperature of the plating bath may be higher. In one embodiment, development times ranging from about 5 minutes to about 30 minutes may be used to create the space 220.

Figure 14:
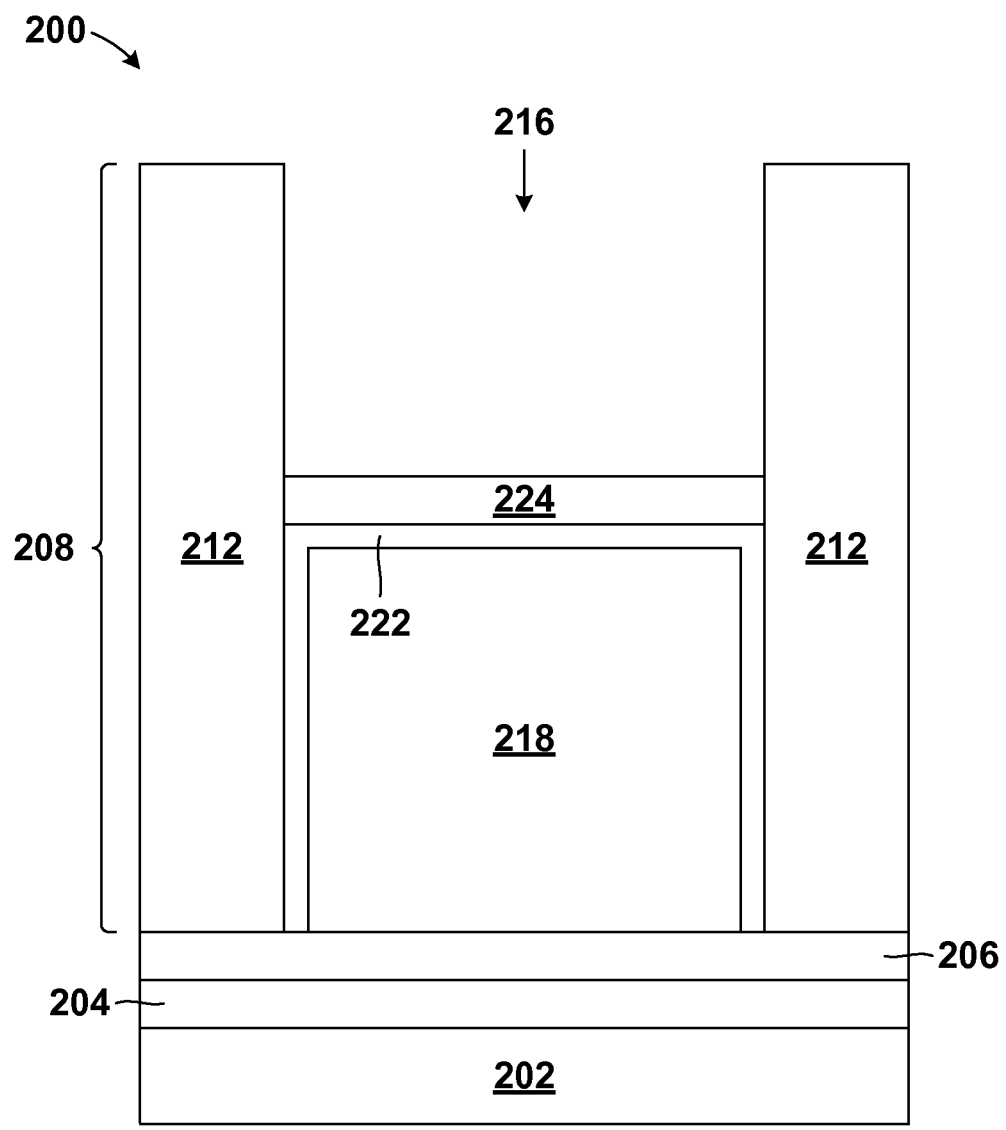

Referring now to FIG. 14, a metal layer 222 may be electrolytically deposited on top of the copper pillar 218 and within the space 220, as illustrated. The metal layer 222 may be directly applied specifically to impact or change the wettability properties of the copper pillar 218, specifically, the wettability of the sidewall of the copper pillar 218. The material of the metal layer 222 may be chosen specifically to either improve or deteriorate the solder wettability of the sidewall of the copper pillar 218.

In an embodiment, the metal layer 222 may include a material which intentionally deteriorates the solder wettability characteristics of the sidewall of the copper pillar 218, such as for example, tin. The metal layer 222 of the present embodiment may be applied relatively thin using known electroplating techniques. In particular, the tin metal layer 222 may have a thickness ranging from about 0.1 μm to about 1.5 μm. In order to achieve the desired non-wettable characteristics, the thickness of the tin should be less about 1.0 μm in order to form a copper-tin ($Cu_3Sn$) intermetallic. If the tin metal layer 222 is thicker than about 1.0 μm, the tin metal layer 222 won't fully convert to $Cu_3Sn$ and instead may form $Cu_6Sn_5$ which may have an opposite effect on the wettability than desired. The $Cu_6Sn_5$ intermetallic may actually improve the wettability of the sidewall of the copper pillar 218. Alternatively, if the desired result is to improve wettability characteristics, the $Cu_6Sn_5$ intermetallic may be formed intentionally using a relatively thick layer of tin. The copper-tin ($Cu_3Sn$) intermetallic may generally form at room temperature; however, known low temperature heating techniques may be used to force the reaction, and ensure the entire tin metal layer 222 is consumed.

With continued reference to FIG. 14, the structure 200 may be heated in a reducing environment to cause an entire thickness of the tin metal layer 222 to fully react with the copper to form the copper-tin ($Cu_3Sn$) intermetallic. In general the copper-tin ($Cu_3Sn$) intermetallic may have poor wettability characteristics and may be generally referred to as a non-wettable barrier layer. It should be noted that in the present embodiment the -tin ($Cu_3Sn$) intermetallic may be formed along both the top and the sidewall of the copper pillar 218 and a metal cap may be subsequently used to generate a wettable surface at the top of the copper pillar 218.

According to another embodiment, the metal layer 222 of FIG. 14 may alternatively be heated in a non-reducing environment or an oxidizing environment. Doing so, may cause the tin metal layer 222 to oxidize. In general, an oxidized metal surface may have poor wettability characteristics which may be used to further tailor the wettability of the copper pillar 218. In such cases, after heating, the tin metal layer 222 may include one or more layers having different compositions, such as, for example, copper-tin ($Cu_3Sn$), tin, and tin-oxide ($SnO_2$), in order. As above, the copper-tin intermetallic will form across the top and along the sidewall of the copper pillar 218.

According to another embodiment, similar techniques, as described above, may also be used to form a nickel-oxide (NiO) from a nickel metal layer (222).

Next, a metal cap 224 may be formed directly on top of the metal layer 222 within the opening 216. In an embodiment, the metal cap 224 may include a material which intentionally improves or enhances the solder wettability characteristics of a top of the copper pillar 218, such as, for example, gold, palladium, or some combination thereof. The metal cap 224 of the present embodiment may be applied relatively thin using known electroplating techniques, such as, for example, the electroplating technique described above.

Figure 15:
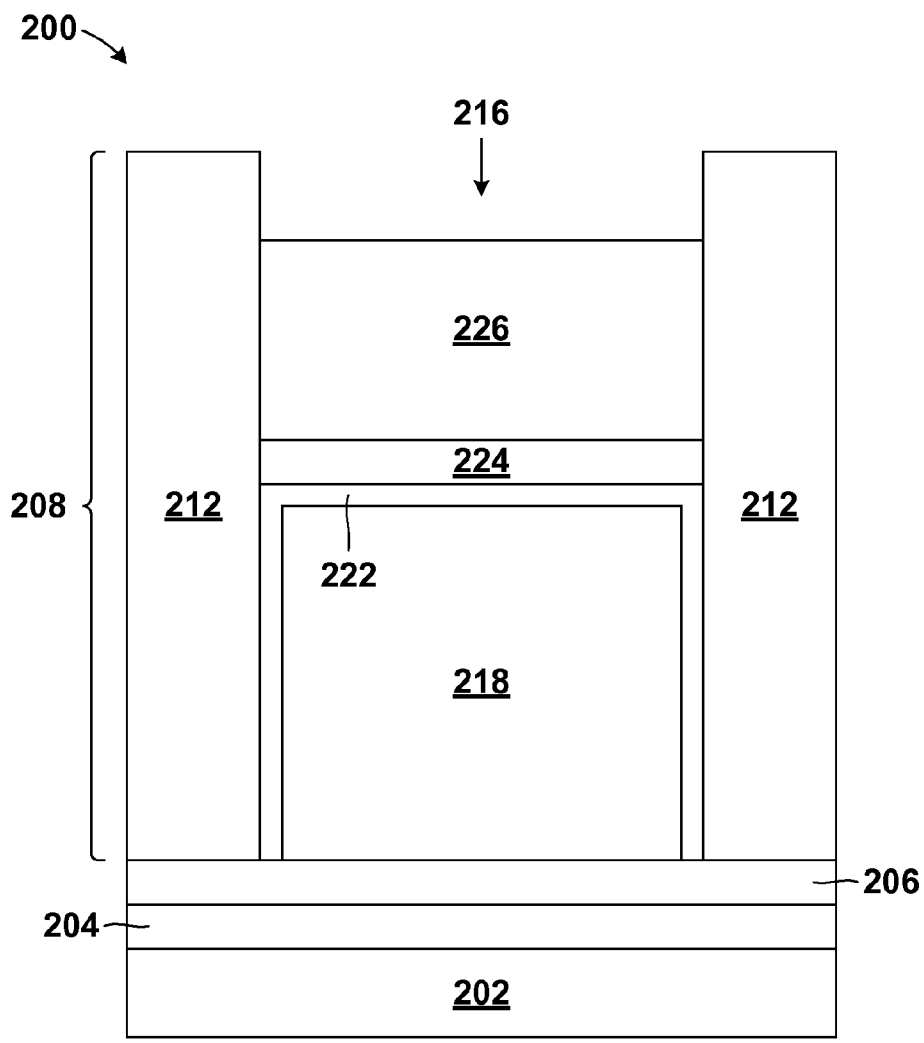

Referring now to FIG. 15, a solder cap 226 may be plated on top of the copper pillar 218 according to known plating techniques, or alternatively by known C4NP techniques. More specifically, the solder cap 226 may be plated to a top surface of the metal cap 224 above the copper pillar 218. In one embodiment, the solder bump 228 may be, about 2 μm to about 30 μm in diameter. It should be noted that the solder bump 228 can wet only to the top surface of the metal cap 224 due in part to the presence of the second portion 212 of the photoresist 208.

Figure 16:
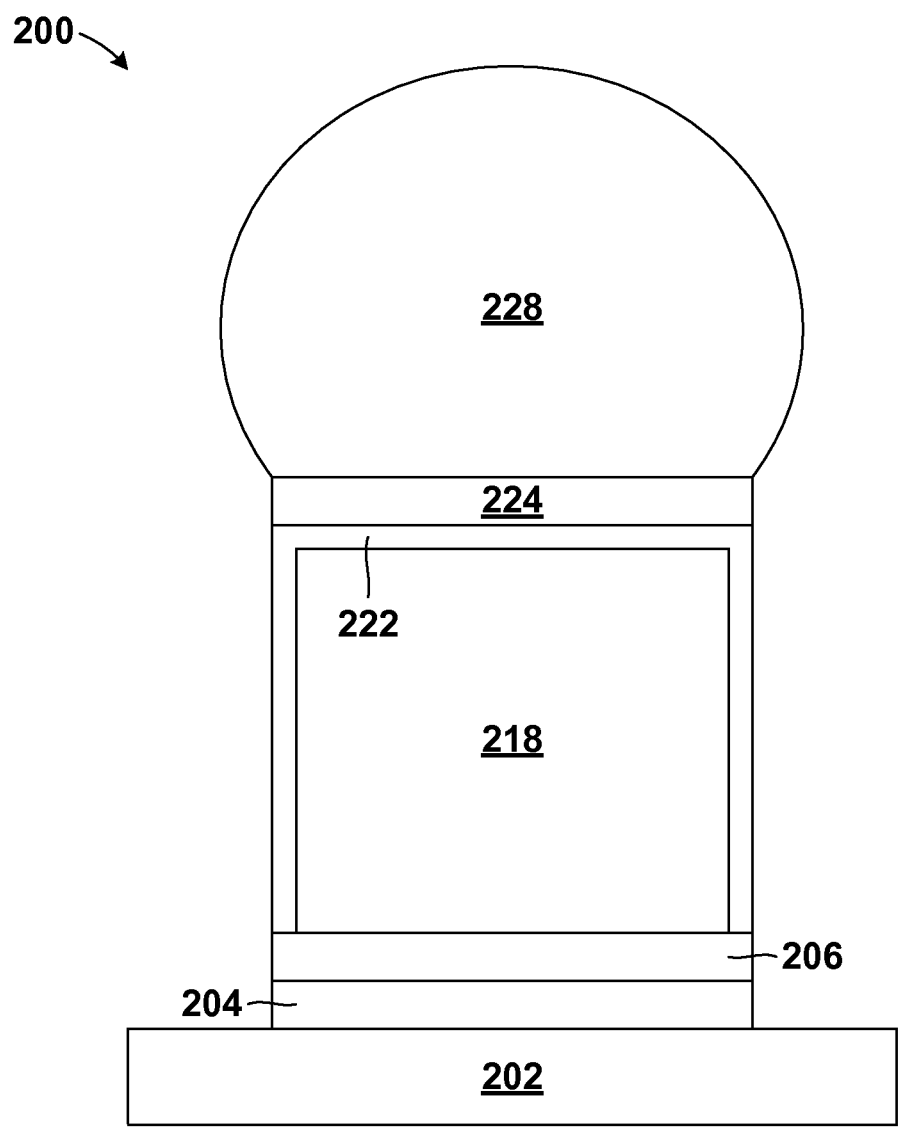

Referring now to FIG. 16, the photoresist 208 is removed. The photoresist 208 may be removed or stripped using known techniques and typical strippers. For example, the photoresist 208 can be removed using TMAH with a high pH content, with glycol to assist in swelling and NMP to aid in dissolution. Alternatively, the photoresist 208 can be stripped using sodium or potassium hydroxide.

At the present step, the interconnect material of multiple features across a wafer may remain electrically connected through the second layer 206. Therefore, after plating the interconnect material of the copper pillar 218, portions of the stack of layers, for example the first and the second layers 204, 206, may be removed from the structure 200 to purposefully break any electrical connection between multiple features across the wafer. To that end, the portion of the stack of layers may preferably be removed from areas of the structure 200 unrelated to the conductive feature. Stated differently, the portion of the stack of layers may preferably be removed from the structure 200 everywhere there is not a conductive feature, for example, the copper pillar 218.

The portion of the stack of layers may be removed from the structure 200, as illustrated, using a variety of removal techniques. The portion of the stack of layers may be remove in multiple steps, one or two layers at a time, or in a single step. The portion of the stack of layers may be removed using any one of a variety of removal techniques, such as, for example, chemical mechanical polishing, dry etching (e.g. RIE), wet etching, or laser ablation.

Next, the structure 200 may be heated to cause the solder cap 226 to reflow and create a solder bump 228. In an embodiment, a low temperature solder paste may be heated to melt in a reflow furnace and then cooled down to form their shapes according to their surface. It should be noted that the surface tension of the molten solder may define the spherical or hemispherical shape of the solder bump 228. Furthermore, the surface tension of the molten solder may restrict or limit the molten solder from extending of flowing beyond an outer edge of the top surface of the metal cap 224. In situations where the solder bump is relatively large, the surface tension may be overcome, and the molten solder may wet the sidewall of the metal cap 224. Alternatively, combinations of the materials and techniques described above may be use to generate a copper pillar having customize wettability characteristics.

Figure 17:
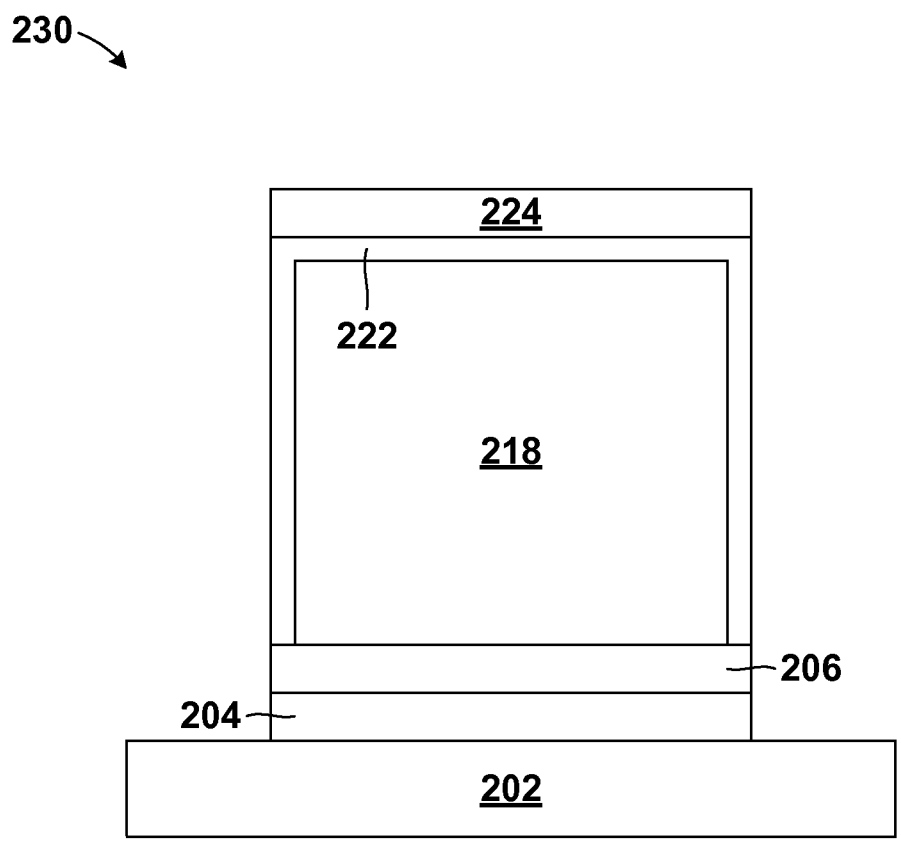

Referring now to FIG. 17, an alternative structure 230 according to the above embodiment is shown. The structure 230 may represent a copper pillar interconnect structure similar to the structure 200 but without a solder bump. In such cases, the solder may be provided on a mating surface opposite the metal cap 224 in the flip chip assembly. During assembly, as previously described, molten solder will only wet to the metal cap 224 and not to the metal layer 222.

Figure 18:
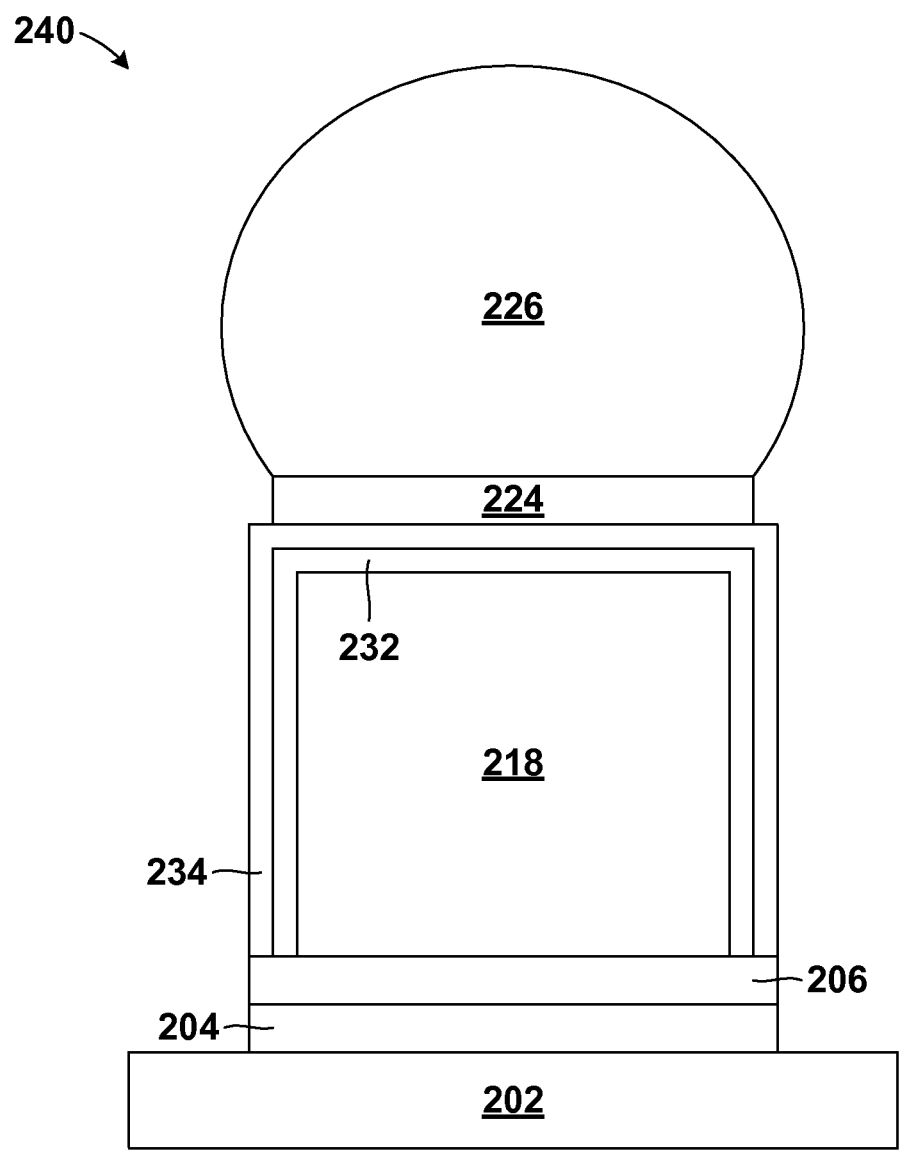

Referring now to FIG. 18, an alternative structure 240 according to the above embodiment is shown. The structure 240 may represent a fully wettable copper pillar interconnect structure without a solder bump. In such cases, one or more metal layers, for example a first metal layer 232 followed by a second metal layer 234 may be electrolytically deposited, in order, on the copper pillar 218. In one embodiment, the first metal layer 232 may be nickel and the second metal layer 234 may be gold or palladium. The first metal layer 232 may be used to improve adhesion between the copper pillar 218 and the second metal layer 234. More specifically, a thin layer of nickel may be plated first to provide improved adhesion for the subsequent plating of the gold or palladium, and each layer need only be thick enough to fully coat the surface of the copper pillar 218. As referenced above, the gold and palladium may be used specifically to provide good solder wettability characteristics. In the present example, the second metal layer 234 may be conformally plated on both the top and sidewall of the copper pillar 218 to create a fully wettable copper pillar 218.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a copper pillar;
   electroplating a metal layer on a top surface and a sidewall of the copper pillar;
   electroplating a metal cap above the top surface of the copper pillar in direct contact with the metal layer, wherein the metal cap is less than 1 μm; and
   forming an intermetallic by heating the metal layer and the copper pillar in a non-reducing environment, the intermetallic comprising elements of both the copper pillar and the metal layer, wherein the intermetallic comprises one of: only $Cu_3Sn$; only $Cu_3Sn$ and $SnO_2$; and only tin, $Cu_3Sn$, and $SnO_2$,
   wherein molten solder will wet to the metal cap and will not wet to the intermetallic.

2. The method of claim 1, wherein forming the copper pillar comprises:
   patterning an opening in a photoresist layer above a quad layer plating structure comprising a first layer, a second layer, a third layer, and a fourth layer, each layer is conductive and is formed successively one on top of another; and
   electroplating the copper pillar structure in the opening by applying an electrical potential to the second layer, copper from a plating solution plates out on the fourth layer exposed at a bottom of the opening.

3. The method of claim 1, wherein forming the copper pillar comprises:
   patterning an opening in a photoresist layer;
   electroplating the copper pillar structure in the opening; and
   removing a portion of the photoresist layer immediately adjacent to the copper pillar to form a space, the space is formed by exposing the photoresist layer to a high temperature high pH plating bath.

4. The method of claim 1, wherein the metal layer comprises tin and the metal cap comprises gold.

5. The method of claim 1, further comprising:
   forming a solder bump directly on top of the metal cap.

6. The method of claim 1, further comprising:
   electroplating a solder cap directly on top of the metal cap; and
   heating the solder cap to a molten state after completely removing the photoresist layer.

7. A method comprising:
   forming a copper pillar;
   forming a solder bump directly on a top surface of the copper pillar by electroplating a solder cap and reflowing the solder cap to form the solder bump;
   electroplating a metal layer on a top surface of the solder bump and on a sidewall of the copper pillar, wherein the metal layer comprises tin and is less than 1 μm; and
   forming an intermetallic from a first portion of the metal layer in contact with the sidewall of the copper pillar by heating the metal layer and the copper pillar in a non-reducing environment, the intermetallic comprising elements of both the copper pillar and the metal layer, a second portion of the metal layer in contact with the solder bump remains unreacted, wherein forming the intermetallic includes:
   converting a portion of the metal layer in direct contact with the copper pillar to $Cu_3Sn$; and
   oxidizing an outermost portion of the metal layer to forming $SnO_2$,
   wherein the intermetallic comprises one of: only $Cu_3Sn$; only $Cu_3Sn$ and $SnO_2$; and only tin, $Cu_3Sn$, and $SnO_2$.

8. The method of claim 7, wherein forming the copper pillar comprises:
   patterning an opening in a photoresist layer above a quad layer plating structure comprising a first layer, a second layer, a third layer, and a fourth layer, each layer is conductive and is formed successively one on top of another; and
   electroplating the copper pillar structure in the opening by applying an electrical potential to the second layer, copper from a plating solution plates out on the fourth layer exposed at a bottom of the opening.

9. The method of claim 7, wherein forming the copper pillar comprises:
   patterning an opening in a photoresist layer;
   electroplating the copper pillar structure in the opening; and
   removing a portion of the photoresist layer immediately adjacent to the copper pillar to form a space, the space is formed by exposing the photoresist layer to a high temperature high pH plating bath.

10. The method of claim 7, wherein forming the solder bump directly on top of the copper pillar comprises:
    electroplating a solder cap directly on top of the copper pillar and within the opening;
    removing the photoresist layer; and
    reflowing the solder cap to form a hemispherical solder bump in which the surface tension limits molten solder from extending beyond the top surface of the copper pillar during reflow.

11. The method of claim 7, further comprising:
    heating the solder bump to a molten state after formation of the intermetallic,
    wherein molten solder will wet to the top surface of the copper pillar and will not wet to the intermetallic.

12. A method comprising:
    forming a copper pillar;
    electroplating a first metal layer on a top surface and a sidewall of the copper pillar;
    electroplating a second metal layer on top of the first metal layer, wherein the second metal layer is less than 1 µm; and
    forming an intermetallic by heating the first metal layer and the copper pillar in a non-reducing environment, the intermetallic comprising elements of both the copper pillar and the metal layer, wherein the intermetallic comprises one of: only $Cu_3Sn$; only $Cu_3Sn$ and $SnO_2$; and only tin, $Cu_3Sn$, and $SnO_2$
    wherein molten solder will wet to the second metal layer.

13. The method of claim 12, wherein forming the copper pillar comprises:
    patterning an opening in a photoresist layer above a quad layer plating structure comprising a first layer, a second layer, a third layer, and a fourth layer, each layer is conductive and is formed successively one on top of another;
    electroplating the copper pillar structure in the opening by applying an electrical potential to the second layer, copper from a plating solution plates out on the fourth layer exposed at a bottom of the opening;
    removing an exposed portion of the quad layer plating structure such that a remaining portion of the quad layer plating structure remains beneath the copper pillar; and
    removing remaining exposed layers of the quad layer plating structure.

14. The method of claim 12, wherein forming the copper pillar comprises:
    patterning an opening in a photoresist layer;
    electroplating the copper pillar structure in the opening; and
    removing a portion of the photoresist layer immediately adjacent to the copper pillar to form a space, the space is formed by exposing the photoresist layer to a high temperature high pH plating bath.

15. The method of claim 12, wherein the first metal layer comprises tin, nickel, or some combination thereof.

16. The method of claim 12, wherein the second metal layer comprises gold, palladium, or some combination thereof.

* * * * *